US010879284B2

(12) United States Patent
Nakajun et al.

(10) Patent No.: US 10,879,284 B2
(45) Date of Patent: Dec. 29, 2020

(54) IMAGING DEVICE HAVING A PIXEL ELECTRODE OVERLAPPING A DISCHARGE ELECTRODE AND ASSOCIATED CAMERA SYSTEM

(71) Applicant: Panasonic Intellectual Property Management Co., Ltd., Osaka (JP)

(72) Inventors: Akio Nakajun, Osaka (JP); Sanshiro Shishido, Osaka (JP); Shunsuke Isono, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/991,676

(22) Filed: May 29, 2018

(65) Prior Publication Data

US 2018/0350862 A1 Dec. 6, 2018

(30) Foreign Application Priority Data

Jun. 6, 2017 (JP) ................................ 2017-111704

(51) Int. Cl.
*H01L 27/146* (2006.01)
*H01L 27/30* (2006.01)

(52) U.S. Cl.
CPC .... *H01L 27/14612* (2013.01); *H01L 27/1463* (2013.01); *H01L 27/14605* (2013.01);
(Continued)

(58) Field of Classification Search
CPC ....... H01L 27/14665–14676; H01L 27/14893; H01L 27/307; H01L 27/14663;
(Continued)

(56) References Cited

U.S. PATENT DOCUMENTS

2008/0224136 A1* 9/2008 Wang ................. H01L 27/1463 257/53
2009/0127599 A1* 5/2009 Kim ................. H01L 27/14634 257/292

(Continued)

FOREIGN PATENT DOCUMENTS

JP 63-275170 11/1988
JP 2011-204992 10/2011
JP 2011-238781 11/2011

*Primary Examiner* — Younes Boulghassoul
(74) *Attorney, Agent, or Firm* — McDermott Will & Emery LLP

(57) ABSTRACT

An imaging device includes a pixel, the pixel including a photoelectric converter which converts light into a signal charge and a charge detection circuit which detects the signal charge. The photoelectric converter includes a photoelectric conversion layer having a first surface and a second surface opposite to the first surface, a pixel electrode on the first surface, a first electrode adjacent to the pixel electrode on the first surface, the first electrode being electrically conductive to the photoelectric conversion layer, and a counter electrode on the second surface, the counter electrode facing the pixel electrode and the first electrode. A shortest distance between the pixel electrode and the first electrode in a plan view is smaller than a shortest distance between the pixel electrode and the first electrode.

16 Claims, 19 Drawing Sheets

L 110 141 142 171 161 151 202 201 111 112 101 400 220 221 103 411 412 413 131 132 133 421 422 423 401 103 402 200 102 121 102

(52) U.S. Cl.
CPC .. *H01L 27/14623* (2013.01); *H01L 27/14638* (2013.01); *H01L 27/14663* (2013.01); *H01L 27/14676* (2013.01); *H01L 27/14689* (2013.01); *H01L 27/307* (2013.01); *H01L 27/14654* (2013.01)

(58) Field of Classification Search
CPC ........... H01L 27/14623; H01L 27/1463; H01L 27/14654; H01L 27/14818; H01L 27/14887; H01L 27/14636; H01L 27/14638; H01L 27/14605
See application file for complete search history.

(56) References Cited

U.S. PATENT DOCUMENTS

2011/0233707 A1 9/2011 Fukuro et al.
2012/0286137 A1* 11/2012 Yamaguchi ....... H01L 27/14623 250/208.1
2013/0341491 A1* 12/2013 Hirose ................ H01L 27/1464 250/208.1
2014/0035082 A1* 2/2014 Chu .................... H01L 27/1463 257/432
2014/0117486 A1* 5/2014 Doi .................. H01L 27/14665 257/448
2015/0325606 A1* 11/2015 Togashi ............ H01L 27/14609 250/208.1
2016/0035772 A1* 2/2016 Yamashita ........ H01L 27/14643 257/432
2016/0035780 A1* 2/2016 Itahashi ............ H01L 27/14665 348/294
2016/0093657 A1* 3/2016 Ryoki ............... H01L 27/14632 257/448
2016/0119563 A1* 4/2016 Yamada ............ H01L 27/14667 348/230.1
2018/0219046 A1* 8/2018 Yamaguchi ....... H01L 27/14623
2018/0240847 A1* 8/2018 Ota .................. H01L 21/76898
2018/0342558 A1* 11/2018 Hirata .................. H04N 5/3696
2019/0132536 A1* 5/2019 Watanabe ......... H01L 27/14607

* cited by examiner 300
303
CAMERA SIGNAL PROCESSOR
302
SYSTEM CONTROLLER
100
IMAGING DEVICE
301

IMAGING DEVICE HAVING A PIXEL ELECTRODE OVERLAPPING A DISCHARGE ELECTRODE AND ASSOCIATED CAMERA SYSTEM

BACKGROUND

1. Technical Field

The present disclosure relates to imaging devices.

2. Description of the Related Art

Imaging devices using photoelectric conversion have been conventionally known. For example, a complementary metal oxide semiconductor (CMOS) imaging device having a photodiode is used.

The imaging device includes a plurality of pixels arranged in a matrix. Each pixel includes a photoelectric converter which converts light into an electric charge and a charge detection circuit which detects the electric charge. The charge detection circuit includes a charge accumulator which accumulates charges acquired by conversion at the photoelectric converter. In this imaging device, light may directly reach the charge detection circuit. For example, when light reaches the charge accumulator, a false signal occurs, thereby degrading image quality.

Japanese Unexamined Patent Application Publication No. 2011-204992 discloses an imaging device having a light-shielding film made of tungsten formed on a charge accumulator.

SUMMARY

An imaging device capable of inhibiting leak-in of light to the charge detection circuit has been desired.

One non-limiting and exemplary embodiment provides an imaging device described below. In one general aspect, the techniques disclosed here feature an imaging device including a pixel, the pixel including a photoelectric converter which converts light into a signal charge and a charge detection circuit which detects the signal charge. The photoelectric converter includes a photoelectric conversion layer having a first surface and a second surface opposite to the first surface, a pixel electrode on the first surface, a first electrode adjacent to the pixel electrode on the first surface, the first electrode being electrically conductive to the photoelectric conversion layer, and a counter electrode on the second surface, the counter electrode facing the pixel electrode and the first electrode. A shortest distance between the pixel electrode and the first electrode in a plan view is smaller than a shortest distance between the pixel electrode and the first electrode.

It should be noted that general or specific embodiments may be implemented as an element, a device, a module, a system, an integrated circuit, a method, or any combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1:
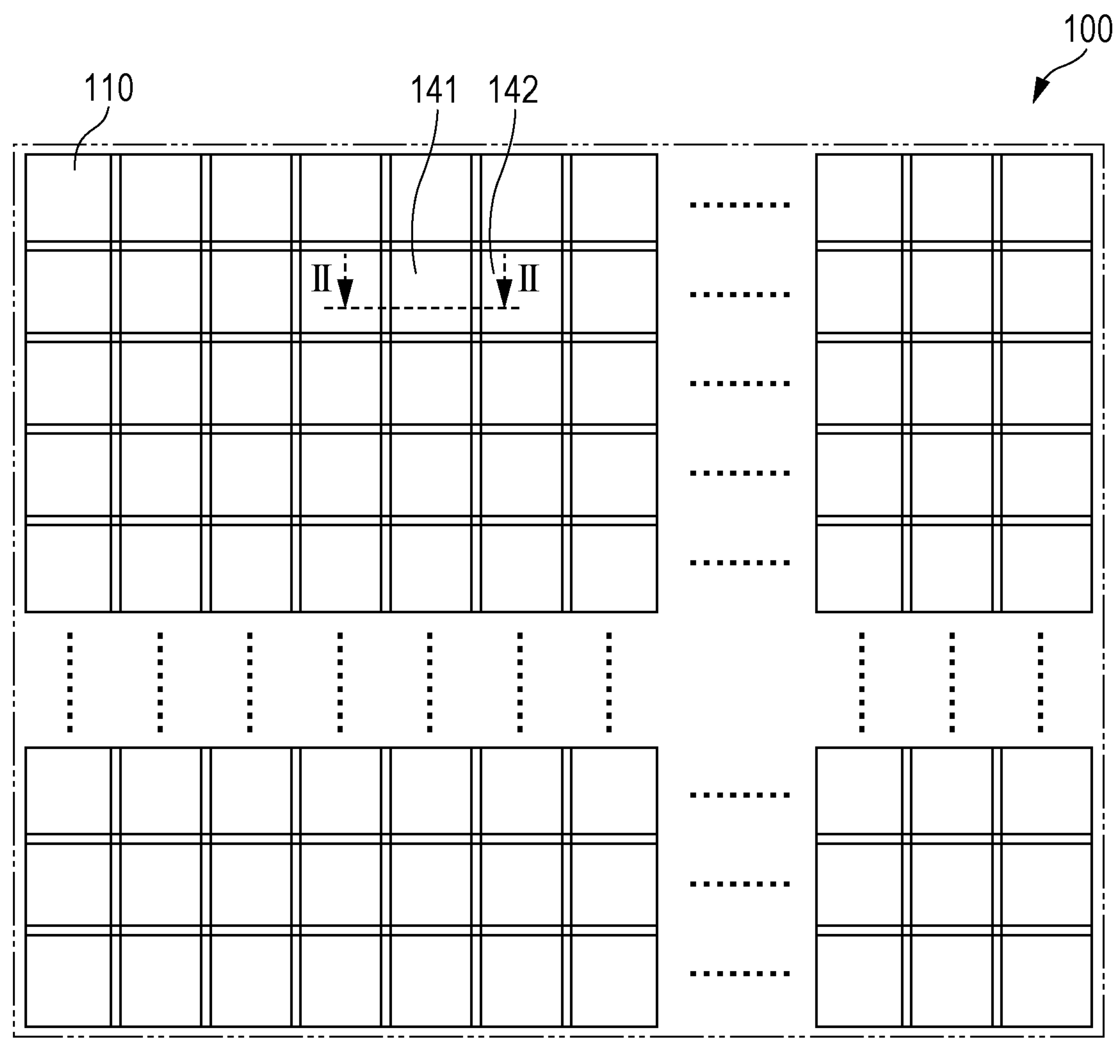
FIG. 1 is a diagram of a planar structure of an imaging device according to a first embodiment.

In the following, embodiments of the present disclosure are described. The embodiments described below represent general or specific examples. Numerical values, shapes, materials, components, arrangement and connection modes of the components, steps, the order of the steps, and so forth are merely examples, and are not meant to restrict the present disclosure. Various aspects described in the specification can be combined unless a contradiction arises. Also, among the components in the following embodiments, a component not described in an independent claim representing a broadest concept is described as an optional component. In the following, components having a substantially same function are represented by a common reference numeral and may not be described.

First, knowledge of the inventor is described.

In recent years, a stacked-type imaging device has been suggested. In the stacked-type imaging device, a photoelectric converter is provided above a semiconductor substrate, and a charge detection circuit is provided on the semiconductor substrate. The photoelectric converter includes a photoelectric conversion film formed across a plurality of pixels and pixel electrodes separated for each pixel. Between the pixel electrodes, an insulating film is normally buried. The transmittance of this insulating film may be higher than the transmittance of the pixel electrodes. In this structure, there is a possibility of leak-in of light from a gap between the adjacent pixel electrodes to directly reach the charge detection circuit. It is useful if this leak-in of light can be inhibited.

An example of this stacked-type imaging device is a CMOS solid-state imaging device. In general, the CMOS solid-state imaging device performs shutter operation and signal reading by so-called rolling operation, in which exposure and signal charge reading are sequentially performed for each row of a pixel array. In a rolling shutter scheme, the start and end of exposure differs for each row of the pixel array. Thus, when an image of a fast-moving subject is taken, a distorted image is acquired as an image of the subject. This is referred to as rolling shutter distortion. Also, if illuminance is greatly changed by flashlight emission or the like in a very short period of time between the start and end of exposure, a so-called flash band phenomenon occurs. A flash band is a phenomenon in which band-shaped portions with different luminance differences occur in an image. This phenomenon occurs because a portion exposed when luminance is increased by an influence of flashlight emission or the like and a portion exposed without the influence of flashlight emission coexist in an image of the same field.

On the other hand, in a global shutter scheme, the timing of the start of exposure and the timing of the end of exposure are common in all pixels in a pixel array. Therefore, problems such as rolling shutter distortion and a flash band can be inhibited. Thus, the global shutter scheme is desired.

The CMOS solid-state imaging device includes a photoelectric converter and a charge accumulation region which temporarily retains charges. In a CMOS solid-state imaging device using the global shutter scheme, light entering the charge accumulation region when the shutter is not open causes a false signal, degrading image quality. The sensitivity when the shutter is not open is referred to as a parasitic light sensitivity (PLS). The PLS is also referred to as parasitic sensitivity or parasitic sensitivity to light.

First Embodiment

Figure 2:
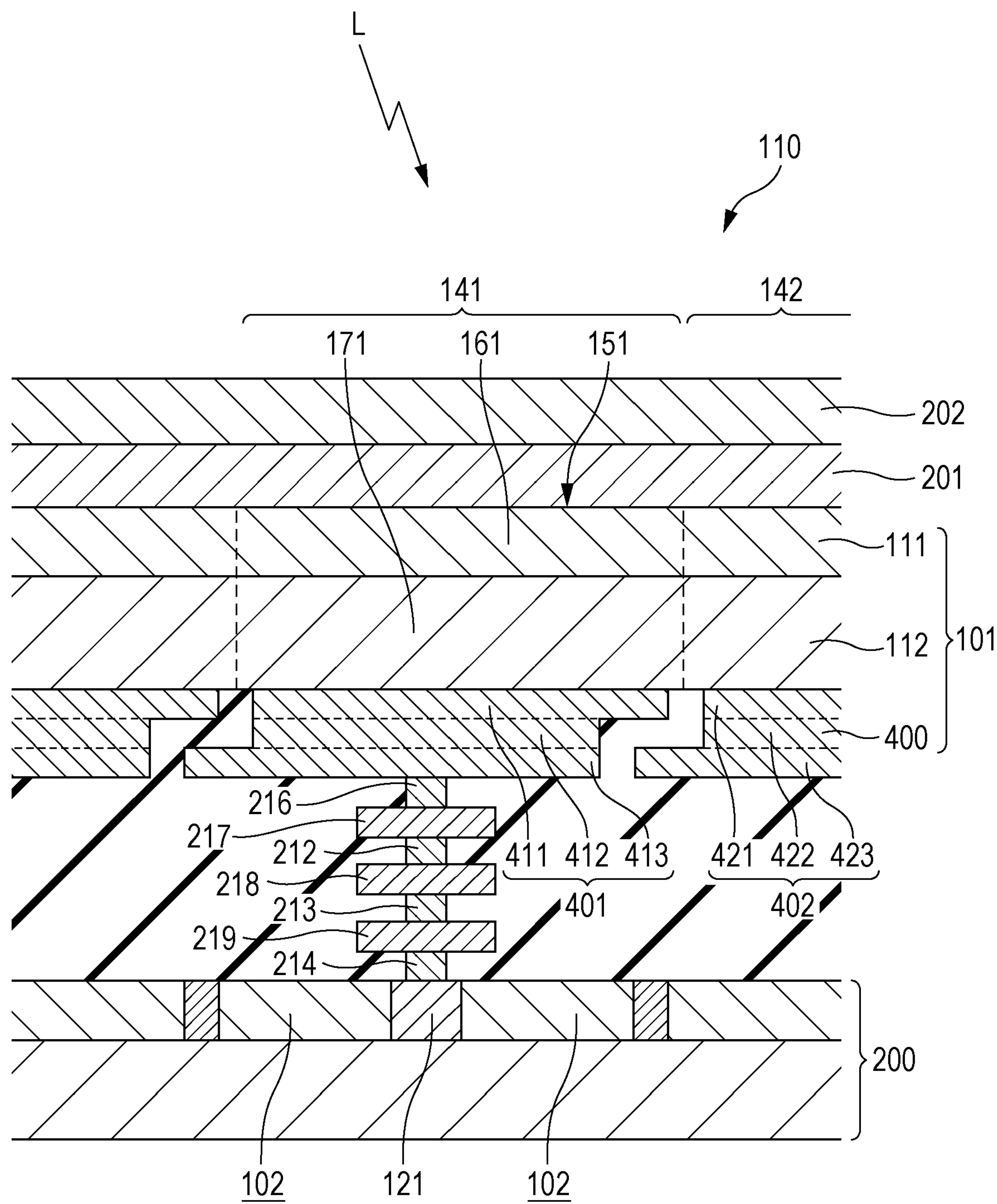
FIG. 2 is a diagram of a sectional structure of the imaging device according to the first embodiment.

FIG. 1 is a diagram depicting a planar structure of an imaging device according to a first embodiment. FIG. 2 is a diagram depicting a sectional structure of the imaging device along a II-II line depicted in FIG. 1.

An imaging device 100 includes a plurality of pixels 110 arranged in a matrix. Each pixel 110 includes a photoelectric converter 101 and a charge detection circuit formed on a semiconductor substrate 200. The semiconductor substrate 200 is formed of, for example, silicon. Also, the imaging device 100 includes a first passivation film 201 provided so as to cover the entire plurality of photoelectric converters 101 and a second passivation film 202 provided so as to cover the entire plurality of photoelectric converters 101. The first passivation film 201 is formed of, for example, aluminum oxide (AlO). The second passivation film 202 is formed of, for example, silicon oxide nitride (SiON).

In FIG. 2, a first pixel 141 and a second pixel 142 included in a plurality of pixels 110 are illustrated. In the following, the first pixel 141 is mainly described. The second pixel 142 and other pixels 110 have a structure similar to that of the first pixel 141.

In the photoelectric converter 101, a first photoelectric converter 151 corresponding to the first pixel 141 converts light L entering from above in FIG. 2 into an electric charge with an amount in accordance with the amount of the incident light. The first photoelectric converter 151 includes a first pixel electrode 401 which collects generated charges, a first counter electrode 161 arranged on an incident side of the light L so as to be opposed to the first pixel electrode 401, and a first photoelectric conversion layer 171 interposed between the first pixel electrode 401 and the first counter electrode 161. The first counter electrode 161 is part of a counter electrode 111. The first photoelectric conversion layer 171 is part of a photoelectric conversion layer 112.

The first photoelectric conversion layer 171 is laminated above the semiconductor substrate 200. The first photoelectric conversion layer 171 is formed of an organic material or an inorganic material such as amorphous silicon. The first photoelectric conversion layer 171 may include a layer configured of an organic material and a layer configured of an inorganic material. The organic material includes, for example, a structure of a junction between a p-type organic semiconductor and an n-type organic semiconductor. As the p-type organic semiconductor, an electron-donating organic compound can be used. Examples of the electron-donating organic compound include a triallylamine compound, a benzidine compound, and a pyrazoline compound. As the n-type organic semiconductor, an electron-attracting compound can be used. Examples of the electron-attracting compound include a heterocyclic compound, a fused aromatic ring carbocyclic compound, and a polyarylene compound of five to seven members containing nitrogen atoms, oxygen atoms, or sulfur atoms.

Note that the photoelectric conversion layer 112 including the first photoelectric conversion layer 171 is provided over the entire pixel 110.

The first counter electrode 161 is formed of a conductive material which lets the light L pass through. The first counter electrode 161 is formed of, for example, indium tin oxide (ITO). The first pixel electrode 401 collects charges generated by photoelectric conversion in the first photoelectric conversion layer 171. The first pixel electrode 401 is provided on a semiconductor substrate 200 side of the first photoelectric conversion layer 171 for each pixel 110. The structure of the first pixel electrode 401 will be described in detail further below. The counter electrode 111 including the first counter electrode 161 is provided over the entire plurality of pixels 110.

As depicted in FIG. 2, the first pixel electrode 401 is connected to a first charge accumulation region 121, which is part of a first charge detection circuit 102, via a fourth plug 214, a third wiring layer 219, a third plug 213, a second wiring layer 218, a second plug 212, a first wiring layer 217, and a first plug 216. The first charge accumulation region 121 is formed on the semiconductor substrate 200. The first charge accumulation region 121 is also referred to as a floating diffusion node. With a potential difference provided between the first pixel electrode 401 and the first counter electrode 161, either one of a positive hole and an electron in a pair occurring in the first photoelectric conversion layer 171 can be collected as a signal charge by the first pixel electrode 401. When the positive hole is used as a signal charge, the potential of the first counter electrode 161 is set higher than that of the first pixel electrode 401. For example, a voltage higher than the potential of the first pixel electrode 401 by approximately 10 V is applied to the first counter electrode 161. This moves the positive hole to the first pixel electrode 401. The positive hole moving to the first pixel electrode 401 is accumulated in the first charge accumulation region 121. As a matter of course, the electron may be used as a signal charge. In the following, description is made to the case where the positive hole is used as a signal charge.

The first charge detection circuit 102 is formed on the semiconductor substrate 200. The first charge detection circuit 102 is formed by, for example, combining a plurality of CMOS transistors. The first charge detection circuit 102 includes, for example, an amplification transistor which outputs a signal corresponding to the charges accumulated in the first charge accumulation region 121 and a reset transistor which resets the first charge accumulation region 121.

In the first pixel 141, the light L enters the first photoelectric conversion layer 171 via the second passivation film 202, the first passivation film 201, and the first counter electrode 161. The first photoelectric conversion layer 171 performs photoelectric conversion on the incident light L to generate a pair of a positive hole and an electron. With a voltage higher than that of the first pixel electrode 401 applied to the first counter electrode 161, the positive hole generated by the first photoelectric conversion layer 171 is collected by the first pixel electrode 401. The positive hole moves from the first pixel electrode 401 to be accumulated in the first charge accumulation region 121. The first charge detection circuit 102 outputs a signal in accordance with the amount of charges accumulated in the first charge accumulation region 121 at a predetermined timing.

The imaging device 100 acquires a signal in accordance with the accumulated amount of charges also from a charge accumulation region of another pixel at a predetermined timing, and generates an image based on the acquired signals.

Figure 3:
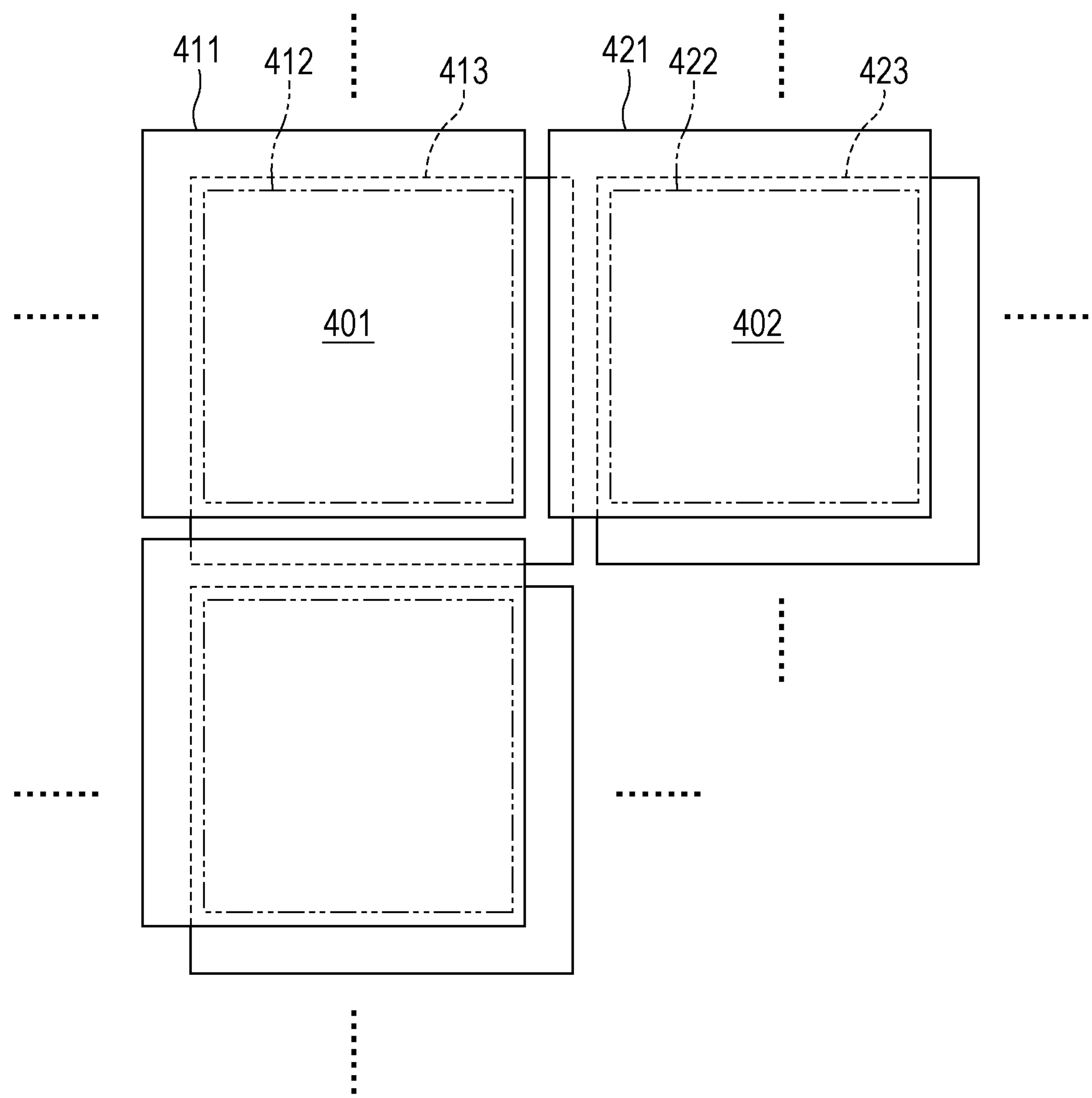
FIG. 3 is a diagram of a planar structure of pixel electrodes of the imaging device according to the first embodiment.

Next, based on FIG. 2 and FIG. 3, the first pixel electrode 401 and the second pixel 142 adjacent to each other are described in detail. The first pixel electrode 401 includes a first layer 411, a second layer 412, and a third layer 413. The first layer 411 is arranged on a first photoelectric conversion layer 171 side, and is in contact with the first photoelectric conversion layer 171. The second layer 412 is arranged on a semiconductor substrate 200 side of the first layer 411, which is opposite to the photoelectric conversion layer 112, and is in contact with the first layer 411. The third layer 413 is arranged on a side of the second layer 412 opposite to the first photoelectric conversion layer 171, and is in contact with the second layer 412.

Similarly, the second pixel 142 has a second pixel electrode 402. The second pixel electrode 402 includes a fourth layer 421, a fifth layer 422, and a sixth layer 423. The fourth layer 421 is arranged on a light incident side. The fifth layer 422 is arranged on a semiconductor substrate 200 side of the fourth layer 421, and is in contact with the fourth layer 421. The sixth layer 423 is arranged on a semiconductor substrate 200 side of the fifth layer 422, and is in contact with the fifth layer 422.

FIG. 3 is a diagram of the first pixel electrodes of the respective pixels 110 adjacent to each other in a plan view from a first photoelectric conversion layer 171 side. Here, the plan view represents a state viewed from a direction vertical to the first photoelectric conversion layer 171.

As depicted in FIG. 3, the area of the first layer 411 and the area of the second layer 412 are different from each other in a plan view. Specifically, the area of the second layer 412 is smaller than that of the first layer 411. While an edge of the first layer 411 and an edge of the second layer 412 do not overlap each other and an edge of the second layer 412 and an edge of the third layer 413 do not overlap each other for the purpose of description in FIG. 3, these edges may overlap in a plan view.

Also, as depicted in FIG. 2 and FIG. 3, the edge of the first layer 411 of the first pixel electrode 401 and an edge of the sixth layer 423 of the second pixel electrode 402 overlap each other in a plan view and, on the other hand, are separated by a predetermined distance in a sectional view. That is, in the first pixel electrode 401 and the second pixel electrode 402, edges of part of the layers overlap each other in the plan view and are separated in the sectional view. Also, a space between the first pixel electrode 401 and the second pixel electrode 402 is filled with an insulating film. That is, an electrically insulating state is kept between the first pixel electrode 401 and the second pixel electrode 402.

Part of the light L passing through the first photoelectric conversion layer 171 can enter the space between the first pixel electrode 401 and the second pixel electrode 402. According to the present embodiment, the light L entering a space between the first layer 411 of the first pixel electrode 401 and the fourth layer 421 of the second pixel electrode 402 is cut off by the edge of the sixth layer 423 of the second pixel electrode 402. Therefore, the light L can be prevented from reaching the first charge accumulation region 121 or a charge accumulation region of another pixel. This can inhibit the occurrence of a false signal in the first charge accumulation region 121.

With the above-described structure provided over the entire plurality of pixels 110, image quality of the image generated by the imaging device 100 can be inhibited from degrading due to a false signal.

In the first pixel electrode 401 and the second pixel electrode 402, an overlapping portion between the first layer 411 of the first pixel electrode 401 and the sixth layer 423 of the second pixel electrode 402 desirably has a larger area in view of light shielding.

The first layer 411 of the first pixel electrode 401 can be formed of, for example, a metal nitride. The first layer 411 can be formed of, for example, titanium nitride (TiN). A Ti simple substance and a Ti compound are chemically stable, and thus have a small possibility of decomposing and adversely affecting the first photoelectric conversion layer 171. Also, Ti is a material for use in general semiconductor manufacturing process. Thus, when Ti is used as a material of the first layer 411, additional facilities and processes do not have to be provided.

The second layer 412 can be formed of the same material as that of the first layer 411. Also, the second layer 412 may be formed of a material different from that of the first layer 411. For example, the second layer 412 can be formed of a material where a crack tends to occur less than the first layer 411. The second layer 412 may be formed of a metal. Alternatively, the second layer 412 may have a laminated structure of a metal and a metal nitride. For example, when the first layer is formed of a metal nitride, there is a possibility that a fine crack is present and that portion lets the light L partially pass through. By forming the second layer 412 of a material where a crack less tends to occur, the light L passing through the first layer 411 can be cut off.

The third layer 413 can be formed of a material similar to those of the first layer 411 and the second layer 412.

Next, a method of manufacturing the imaging device 100 is described.

Figure 4:
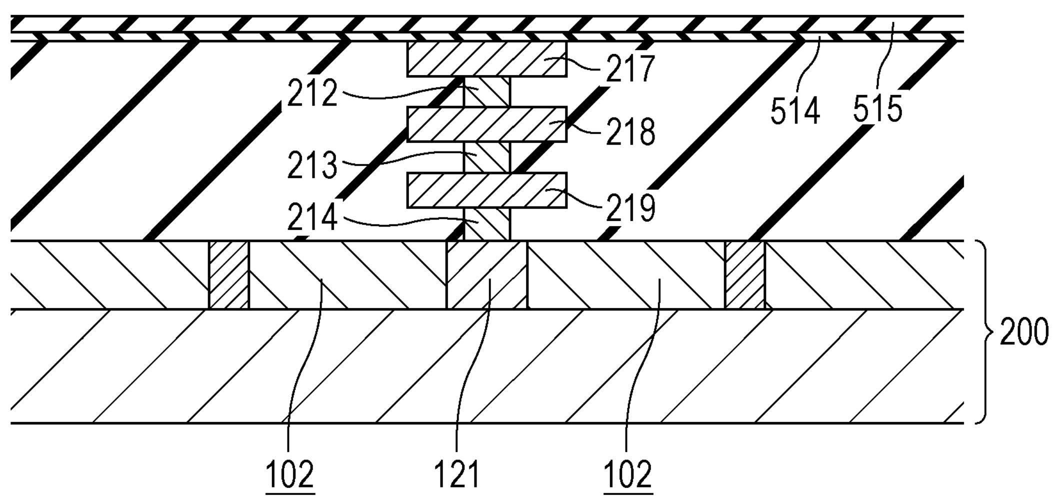
FIG. 4 is a diagram of a sectional structure of the imaging device according to the first embodiment in the middle of the manufacturing processes.

FIG. 4 is a sectional view depicting a first process group of the method of manufacturing the imaging device according to the first embodiment. In the following description, a process of forming the first pixel electrode 401 is mainly described. The second pixel electrode 402 and other pixel electrodes 400 are formed in the same process as that of the first pixel electrode 401. Description of other processes may be omitted. In particular, a process of manufacturing the first charge detection circuit 102 is similar to a normal process of manufacturing a logic CMOS, and is therefore not described herein. Note that the process of manufacturing the first charge detection circuit 102 includes a process of forming the first charge accumulation region 121 on the semiconductor substrate 200. Also, in the following description, an organic film is used as the photoelectric conversion layer 112.

(Formation of Plugs)

In the following, a method of forming the first plug 216 is described. Note that for connection between the first pixel electrode 401 and the first charge accumulation region 121, the fourth plug 214, the third wiring layer 219, the third plug 213, the second wiring layer 218, the second plug 212, and the first wiring layer 217 are formed.

First, as depicted in FIG. 4, a first insulating film 514 and a second insulating film 515 are formed on the first wiring layer 217 by using, for example, chemical vapor deposition (CVD). The first insulating film 514 can be formed of, for example, silicon nitride (SiN), silicon nitride carbide (SiCN), or silicon oxide carbide (SiCO). The second insulating film 515 can be formed of, for example, silicon oxide ($SiO_2$) or carbon-containing silicon oxide (SiOC).

Next, a resist pattern is formed on the second insulating film 515 by using lithography. The resist pattern has a via pattern for forming the first plug 216. By dry etching, a via reaching the first wiring layer 217 is formed in the first insulating film 514 and the second insulating film 515. Then, the resist pattern is removed by ashing.

Subsequently, by using CVD, physical vapor deposition (PVD), and so forth, tantalum nitride (TaN) and tantalum (Ta) are laminated on the first plug 216 to form a first barrier metal film (not depicted). Next, copper (Cu) is deposited as a first metal film. Here, the first barrier metal film may be formed by using titanium (Ti), titanium nitride (TiN), and so forth. Also, the first metal film may be formed by using tungsten (W).

Figure 5:
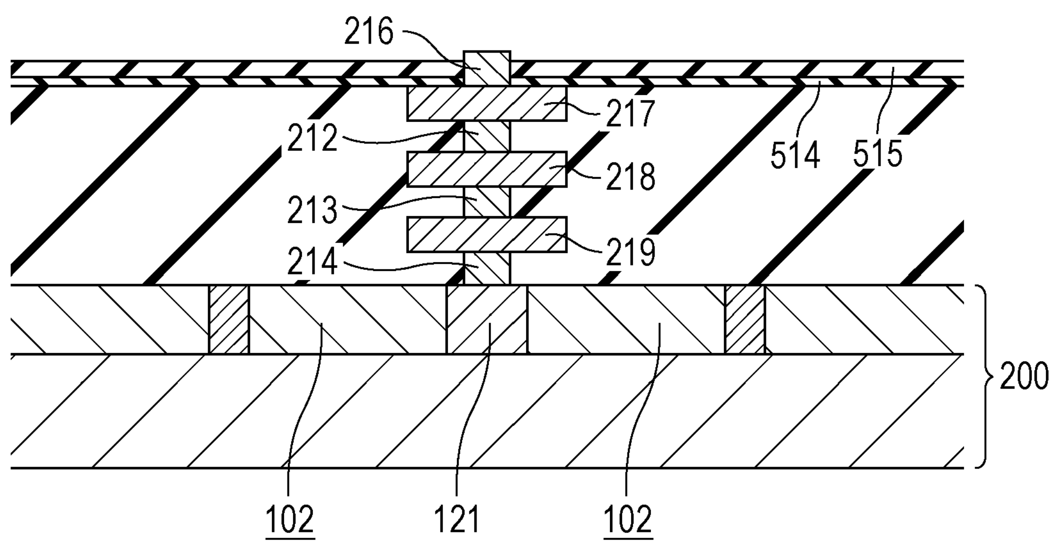
FIG. 5 is a diagram of a sectional structure of the imaging device according to the first embodiment in the middle of the manufacturing processes.

Then, by using chemical mechanical polishing (CMP), superfluous portions of the first metal film and the first barrier metal film deposited on the upper surface of the second insulating film 515 are polished, thereby forming the first plug 216 as depicted in FIG. 5. That is, the first plug 216 includes the first barrier metal film and the first metal film. That is, the first plug 216 above the first charge accumulation region 121 as depicted in FIG. 5 and electrically connected to the first charge accumulation region 121 is formed.

(Formation of Pixel Electrode)

Next, a method of forming the first pixel electrode 401 is described. The method of forming the first pixel electrode 401 is not particularly restrictive. In the following, two typical examples are described by using FIG. 6.

[First Method of Forming Pixel Electrode]

First, a first film is formed over the entire plurality of pixels 110. The first film corresponds to the third layer 413 and the sixth layer 423. The first film can be formed by using CVD or PVD. The first film may be formed by successive deposition so that the composition is changed from a metal to a metal nitride. Alternatively, a plurality of layers with different compositions may be deposited and taken as a first film.

Next, a silicon oxide ($SiO_2$) film (omitted in FIG. 6) is formed on the first film by using CVD. This silicon oxide film inhibits a surface of the first film from being exposed to oxygen even at the time of subsequent ashing. Also, this silicon oxide film can be used as a hard mask when the first film is etched. Formation of the silicon oxide film can be omitted.

Subsequently, resist patterns corresponding to the shapes of the third layer 413 of the first pixel electrode 401 and the sixth layer 423 of the second pixel electrode 402 are formed on the first film by using lithography. Then, by dry etching with the resist patterns as masks, the third layer 413 and the sixth layer 423 are formed. Then, the resist patterns are removed by ashing.

Next, by using at least of CVD and PVD, an insulating film is formed of silicon oxide ($SiO_2$) so as to fill the space between the third layer 413 of the first pixel electrode 401 and the sixth layer 423 of the second pixel electrode 402 adjacent to each other.

Figure 6:
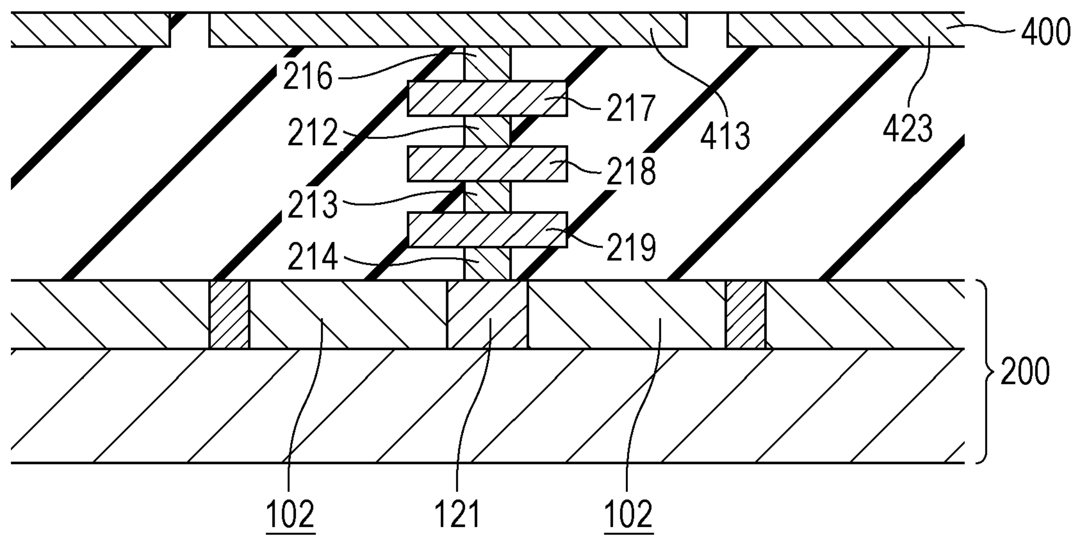
FIG. 6 is a diagram of a sectional structure of the imaging device according to the first embodiment in the middle of the manufacturing processes.

Subsequently, by using CMP or etching back, the insulating film is polished (etched). With this, as depicted in FIG. 6, the third layer 413 of the first pixel electrode 401 and the sixth layer 423 of the second pixel electrode 402 are formed, each having a flat surface.

Figure 7:
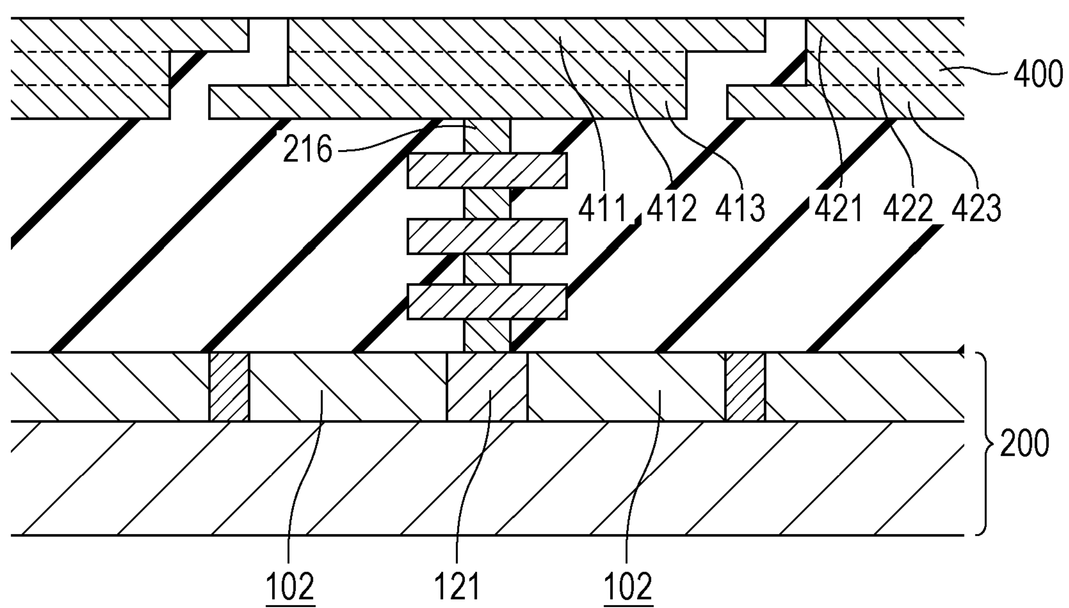
FIG. 7 is a diagram of a sectional structure of the imaging device according to the first embodiment in the middle of the manufacturing processes.

As in the above-described manner, by repeating film formation, lithography, and etching, the second layer 412 and the fifth layer 422, and the first layer 411 and the fourth layer 421 are sequentially formed, each having a predetermined shape, as depicted in FIG. 7. In the first pixel electrode 401, a portion formed by one process among the repeatedly-performed processes as described above such as film formation, lithography, and etching is referred to as a "layer". Also, while the description is made herein to the case where the pixel electrode 400 including the first pixel electrode 401 and the second pixel electrode 402 having three layers is formed, the number of layers to be formed may be any. Furthermore, "electrodes located in the same layer" means a plurality of electrodes having at least one of the layers included in the respective electrodes located at the same height. Still further, in order to ensure electrical conduction, the first layer 411 and the second layer 412 are laminated in direct contact with each other and the second layer 412 and the third layer 413 are laminated in direct contact with each other. Similarly, in order to ensure electrical conduction, the fourth layer 421 and the fifth layer 422 are laminated in direct contact with each other and the fifth layer 422 and the sixth layer 423 are laminated in direct contact with each other.

When the first pixel electrode 401 is formed by the above-described method, the material of the third layer 413 and the second layer 412 is desirably an etchable metal or metal nitride. Also, the third layer 413 and the second layer 412 may be formed as a laminated structure of the etchable metal or metal nitride. Examples of the etchable metal include titanium (Ti), tantalum (Ta), aluminum (Al), and tungsten (W). Also, the material of the first layer 411 is desirably a nitride of the metal.

[Second Method of Forming Pixel Electrode]

First, an insulating film is formed on the first wiring layer 217 by using, for example, chemical vapor deposition (CVD). The insulating film is formed of, for example, silicon nitride (SiN), silicon nitride carbide (SiCN), silicon oxide carbide (SiCO), silicon oxide ($SiO_2$), and carbon-containing silicon oxide (SiOC).

Subsequently, a resist pattern with a pattern corresponding to the shape of the third layer 413 of the first pixel electrode 401 is formed on the insulating film by using lithography (omitted in the drawings).

Then, with the resist pattern as a mask, the insulating film is etched by dry etching, thereby forming a recess corresponding to the third layer 413 of the first pixel electrode 401. Then, the resist pattern is removed by ashing.

Subsequently, by using at least one of CVD and PVD, a first film is formed on the insulating film, in particular, in a recess formed by etching. The first film corresponds to the third layer 413 of the first pixel electrode 401.

Subsequently, by using chemical mechanical polishing (CMP) or the like, a superfluous portion of the first film deposited on the upper surface of the insulating film is polished to form the third layer 413 of the first pixel electrode 401 (refer to FIG. 6).

When the first pixel electrode 401 is formed by the above-described method, the material of the third layer 413 and the second layer 412 may be a hard-to-etch metal such as copper (Cu). The material of the third layer 413 and the second layer 412 may be a material similar to that used in the above-described first forming method.

As described above, by repeating film formation, lithography, etching, and polishing, the second layer 412 and the first layer 411 each having a predetermined shape are sequentially formed (refer to FIG. 7).

(Formation of Photoelectric Conversion Layer)

Figure 8:
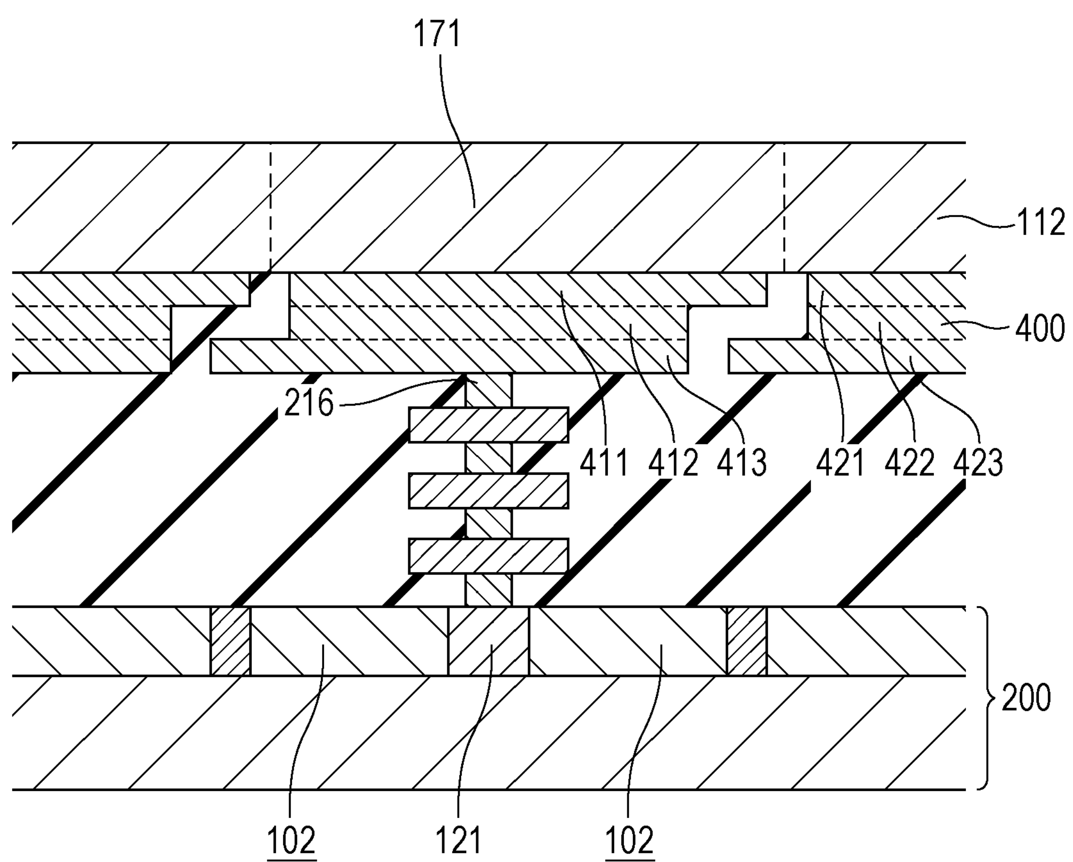
FIG. 8 is a diagram of a sectional structure of the imaging device according to the first embodiment in the middle of the manufacturing processes.

Next, by using vacuum deposition, the photoelectric conversion layer 112 including the first photoelectric conversion layer 171 is formed so as to cover the entire pixel electrode 400 arranged in a matrix over a shadow mask (refer to FIG. 8). Here, at least one of an electron blocking layer and a positive-hole blocking layer may be combined above and below the first photoelectric conversion layer 171.

(Formation of Counter Electrode)

Figure 9:
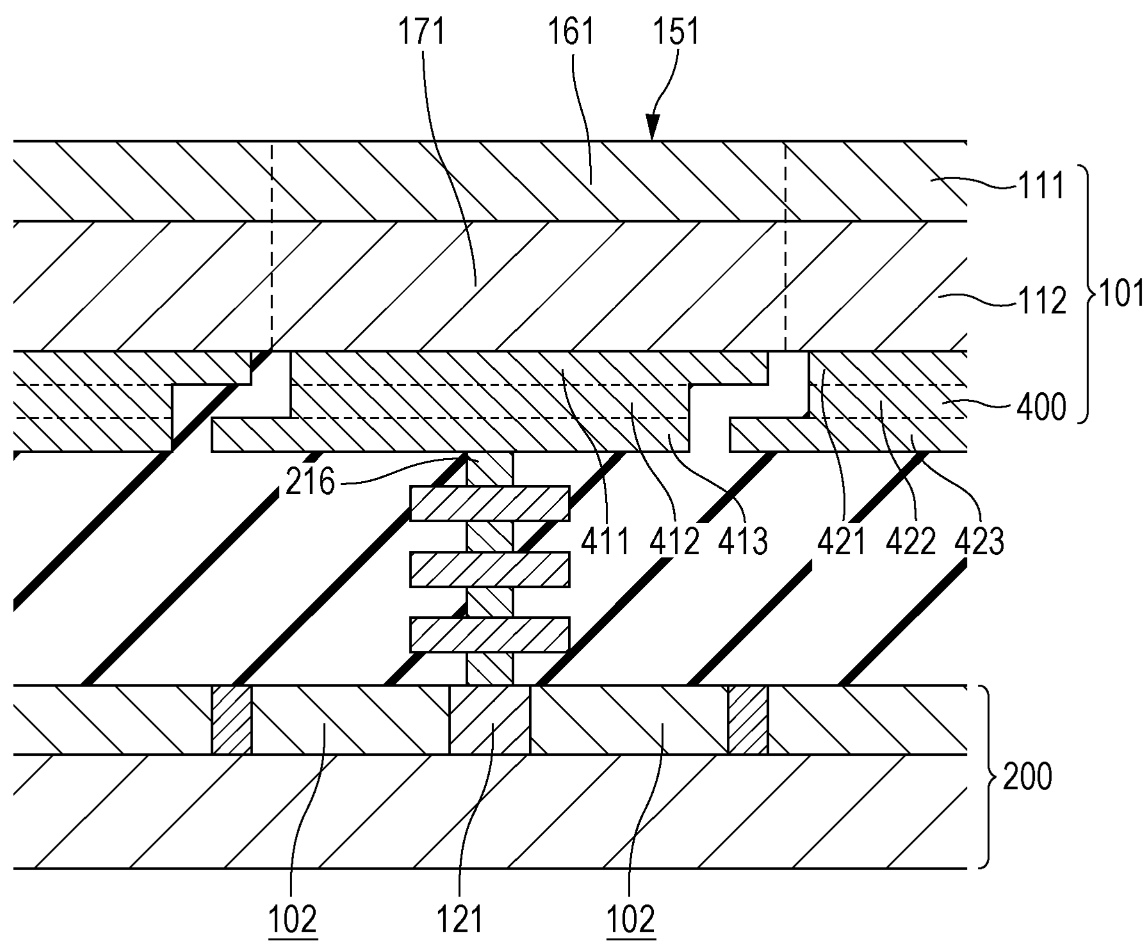
FIG. 9 is a diagram of a sectional structure of the imaging device according to the first embodiment in the middle of the manufacturing processes.

Subsequently, by using PVD or the like, the counter electrode 111 including the first counter electrode 161 is formed (refer to FIG. 9). The counter electrode 111 is formed on the entire photoelectric conversion layer 112 over a shadow mask.

The photoelectric converter 101 including the first photoelectric converter 151 is formed in the above-described manner. The first photoelectric converter 151 is connected to the first charge accumulation region 121 via the first plug 216.

(Formation of Protective Film)

Subsequently, by using CVD or the like, the first passivation film 201 formed of aluminum oxide (AlO) and the second passivation film 202 formed of silicon oxide nitride (SiON) are formed so as to cover the photoelectric converter 101 (refer to FIG. 2). The imaging device 100 is thus formed.

By providing the first passivation film 201 on the photoelectric converter 101, even if a foreign substance is present on the photoelectric converter 101, the photoelectric converter 101 can be inhibited from being exposed to the top. By fabricating the first passivation film by, for example, atomic layer deposition (ALD), the passivation effect can be improved, because plasma is not used in ALD and thus a passivation film can be formed with low damage. Also in ALD, a film having a uniform thickness can be fabricated also on a three-dimensional surface. Therefore, even if a foreign substance is present on the photoelectric converter 101, a passivation film having a uniform thickness can be fabricated on the photoelectric converter 101. This can further reduce the possibility that the photoelectric converter 101 is exposed to the top.

While the film thickness of the first passivation film 201 and the film thickness of the second passivation film 202 are equal to each other in FIG. 2, the second passivation film 202 may be formed so as to be twice or more as thick as the first passivation film 201.

Second Embodiment

The imaging device 100 according to a second embodiment is described. The present embodiment is different from the first embodiment in that a first electrode is provided. A portion having an action, function, shape, mechanism, or structure similar to that of the first embodiment is provided with the same reference numeral and may not be described herein. Also, in the following, points different from the first embodiment are mainly described, and the same details may not be described herein.

Figure 10:
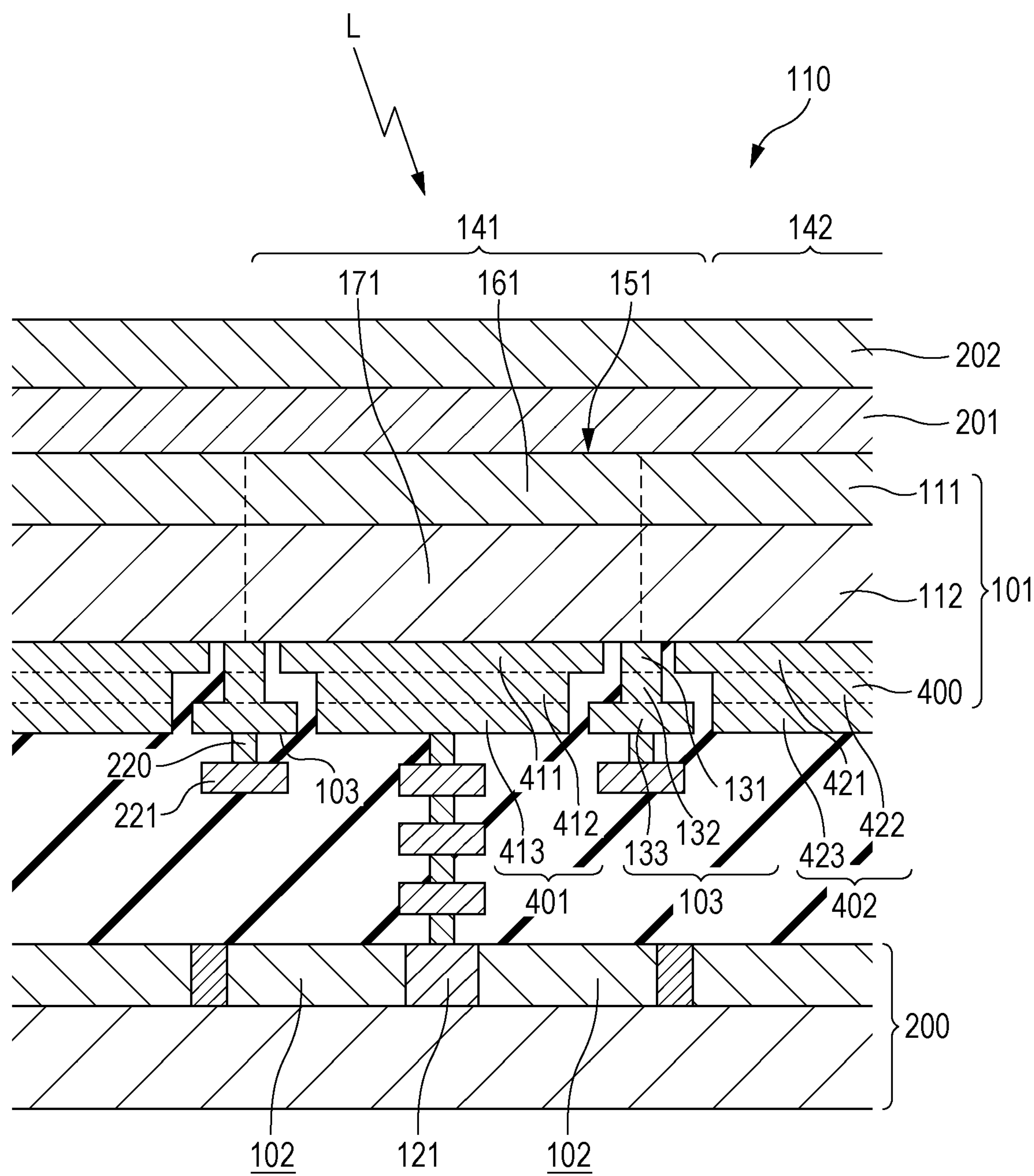
FIG. 10 is a diagram of a sectional structure of an imaging device according to a second embodiment.
Figure 11:
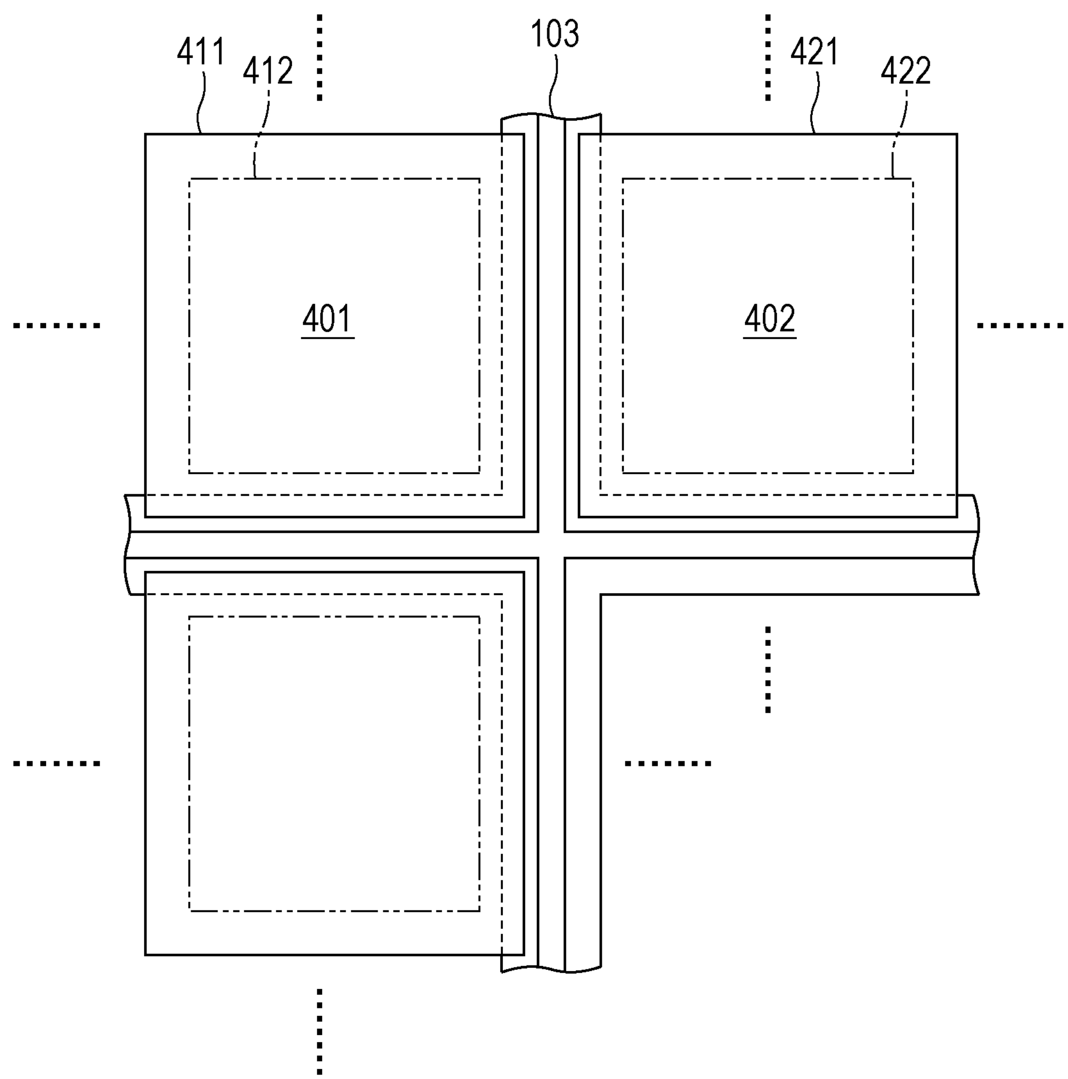
FIG. 11 is a diagram of a planar structure of pixel electrodes of the imaging device according to the second embodiment.

FIG. 10 is a diagram of a sectional structure of the imaging device according to the second embodiment. FIG. 11 is a diagram of the first pixel electrode and the second pixel electrode adjacent to each other and the first electrode therebetween in a plan view from a photoelectric conversion layer side.

As depicted in FIGS. 10 and 11, the imaging device 100 of the second embodiment includes a first electrode 103 located in the same layer as the first pixel electrode 401 and adjacent to the first pixel electrode 401. The first electrode 103 is arranged between the first pixel electrode 401 and the second pixel electrode 402. The first electrode 103 extends among the plurality of first pixel electrodes along a row direction (for example, a lateral direction in FIG. 11) and a column direction (for example, a longitudinal direction in FIG. 11).

The first electrode 103 includes a seventh layer 131, an eighth layer 132, and a ninth layer 133. The seventh layer 131 is arranged on a photoelectric conversion layer 112 side, and is in contact with the photoelectric conversion layer 112. The eighth layer 132 is arranged on a semiconductor substrate 200 side of the seventh layer 131, which is opposite to the photoelectric conversion layer 112, and is in contact with the seventh layer 131. The ninth layer 133 is arranged on a side of the eighth layer 132 opposite to the photoelectric conversion layer 112, and is in contact with the eighth layer 132.

Also, an edge of the first layer 411 of the first pixel electrode 401 and an edge of the ninth layer 133 of the first electrode 103 overlap each other in a plan view and, on the other hand, are separated by a predetermined distance in a sectional view. Also, a space between the first pixel electrode 401 and the first electrode 103 is filled with an insulating film. That is, an electrically insulating state is kept between the first pixel electrode 401 and the first electrode 103.

Also, as depicted in FIG. 10, the first electrode 103 has a convex shape toward the photoelectric conversion layer 112, and the first pixel electrode 401 and the second pixel electrode 402 each have a convex shape toward the semiconductor substrate 200. That is, as depicted in FIG. 11, the area of the first layer 411 of the first pixel electrode 401 is larger than the area of the second layer 412 in a plan view. Also in the plan view, the area of the seventh layer 131 of the first electrode 103 is smaller than the area of the ninth layer 133. Note that the second layer 412 and the third layer 413 of the first pixel electrode 401 have the same shape and area and the fifth layer 422 and the sixth layer 423 of the second pixel electrode 402 have the same shape and area.

This structure can reduce leak-in of the light L to the first charge accumulation region 121 and a charge accumulation region of another pixel. Thus, also in the present embodiment, parasitic light sensitivity can be reduced. In particular, as depicted in FIG. 11, the entire portion where the corners of four pixel electrodes 400 are gathered can be covered with the first electrode 103. Thus, leak-in of the light L can be effectively inhibited. Also, with the area of the first layer 411 of the first pixel electrode 401 larger than the area of the second layer 412, a large area can be ensured where the first pixel electrode 401 and the first photoelectric conversion layer 171 are in contact with each other. Therefore, the sensitivity of the imaging device 100 can be enhanced.

Here, the first electrode 103 is, for example, an electrode for discharging superfluous charges, and is electrically conductive to the first photoelectric conversion layer 171. The first electrode 103 may be in contact with the first photoelectric conversion layer 171. The first electrode 103 is located, for example, between the first pixel electrode 401 and the second pixel electrode 402, and is arranged in a lattice shape among the plurality of pixel electrodes 400. That is, the first electrode 103 is located in the same layer as the first pixel electrode 401 so as to surround the first pixel electrode 401 and the second pixel electrode 402. In other words, when the upper surface of the semiconductor substrate 200 is taken as a reference, the height of the uppermost surface of the first electrode 103 is equal to the height of the uppermost surface of the first pixel electrode 401. Also, the height of the lowermost surface of the first electrode 103 is equal to the height of the lowermost surface of the first pixel electrode 401. The first electrode 103 is connected to a wiring layer 221 via a plug 220. When the imaging device 100 is used, a voltage is applied to the first electrode 103 via the wiring layer 221 and the plug 220, thereby setting the potential of the first electrode 103 at a predetermined value.

The first electrode 103 is formed of a material similar to that of the first pixel electrode 401 and in a process similar to that of the first pixel electrode 401, for example.

Also in the present embodiment, parasitic light sensitivity can be reduced. Also, the charge subjected to photoelectric conversion by the first photoelectric conversion layer 171 on the first electrode 103 is discharged from the first electrode 103. That is, the charge occurring at the boundary between pixels is not taken into the first pixel electrode 401. This can improve resolution of a taken image.

Third Embodiment

Figure 12:
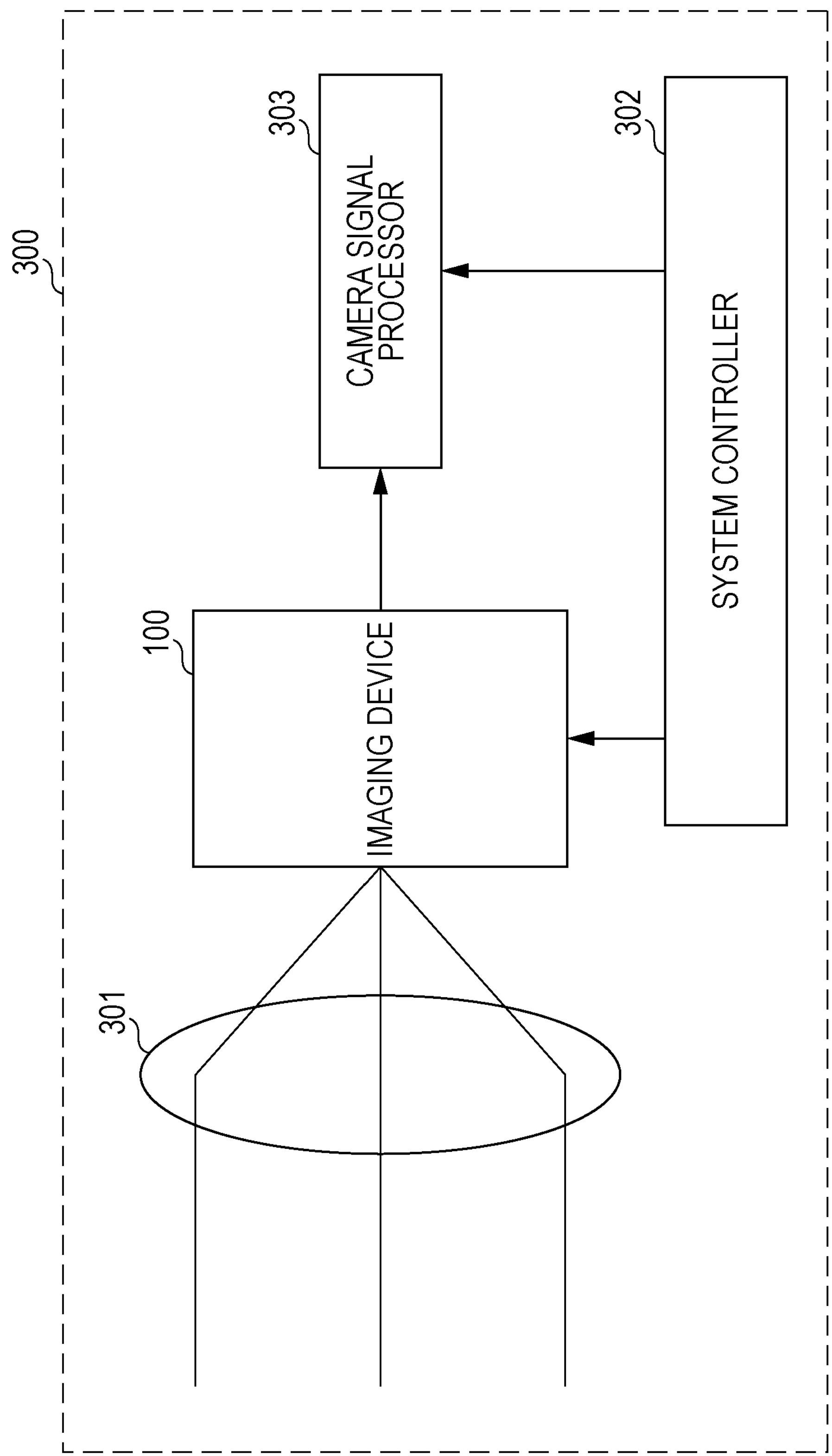
FIG. 12 is a diagram schematically depicting an example of structure of a camera system.

With reference to FIG. 12, a camera system 300 including the imaging device 100 according to a third embodiment is described.

FIG. 12 schematically depicts an example of structure of the camera system 300 according to the present embodiment. The camera system 300 includes a lens optical system 301, the imaging device 100, a system controller 302, and a camera signal processor 303.

The lens optical system 301 includes, for example, an autofocus lens, a zoom lens, and a diaphragm. The lens optical system 301 gathers light onto an image surface of the imaging device 100.

As the imaging device 100, the imaging device 100 according to the above-described embodiments is used. The system controller 302 controls the entire camera system 300. The system controller 302 can be achieved by, for example, a microcomputer.

The camera signal processor 303 functions as a signal processing circuit which processes an output signal from the imaging device 100. The camera signal processor 303 performs, for example, gamma correction, color interpolation process, space interpolation process, auto white balance, and so forth. The camera signal processor 303 can be achieved by, for example, a digital signal processor (DSP).

According to the camera system 300 of the present embodiment, the imaging device 100 according to any of the above-described embodiments is used, and thus the light L can be inhibited from reaching the charge accumulation region including the first charge accumulation region 121. This can reduce parasitic light sensitivity of the imaging device 100, allowing a favorable image to be acquired.

Note that the present disclosure is not limited to the above-described embodiments. For example, as an embodiment of the present disclosure, another embodiment achieved by combining the components described in the specification in any manner or removing some of the components may be taken. Also, modification examples acquired by providing various modifications conceived by a person skilled in the art in a range not deviating from the meaning indicated by the text in the claims are also included in the present disclosure.

Figure 13:
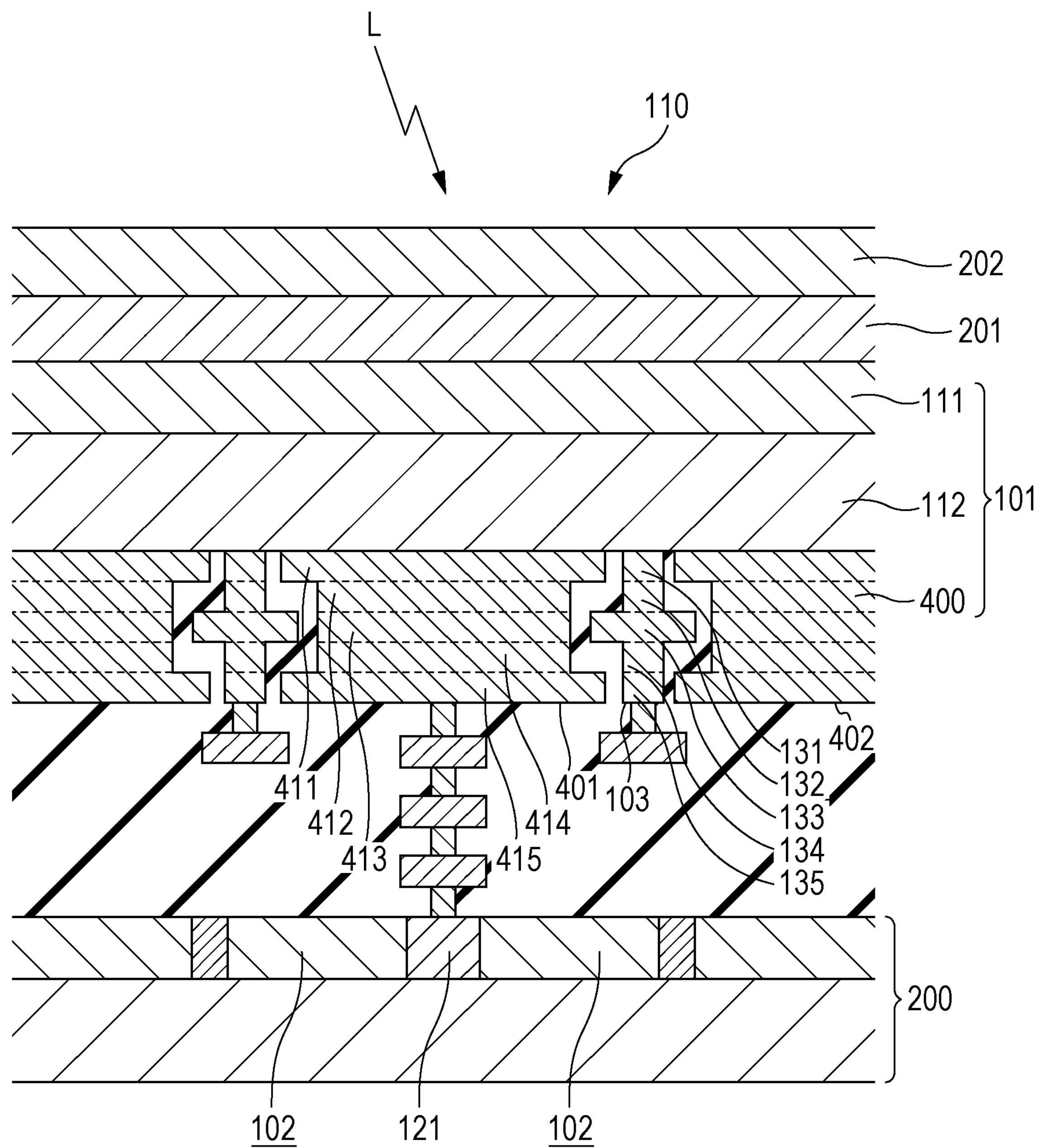
FIG. 13 is a sectional view of an example of variations of an electrode shape.

For example, as depicted in FIG. 13, in the first pixel electrode 401 and the first electrode 103 located in the same layer and adjacent to each other, three or more of a plurality of layers forming each electrode may alternately protrude to have the edges overlap each other a plurality of times in a plan view.

In the structure depicted in FIG. 13, the first pixel electrode 401 has a tenth layer 414 and an eleventh layer 415, in addition to the first layer 411 to the third layer 413. The first electrode 103 has a twelfth layer 134 and a thirteenth layer 135, in addition to the seventh layer 131 to the ninth layer 133. In a plan view, the first layer 411 and the eleventh layer 415 of the first pixel electrode 401 and the ninth layer 133 of the first electrode 103 overlap one another.

This structure can improve light blocking capability with respect to the light L diagonally entering between the first pixel electrode 401 and the second pixel electrode 402 adjacent to each other. This can further reduce parasitic light sensitivity of the imaging device.

Figure 14:
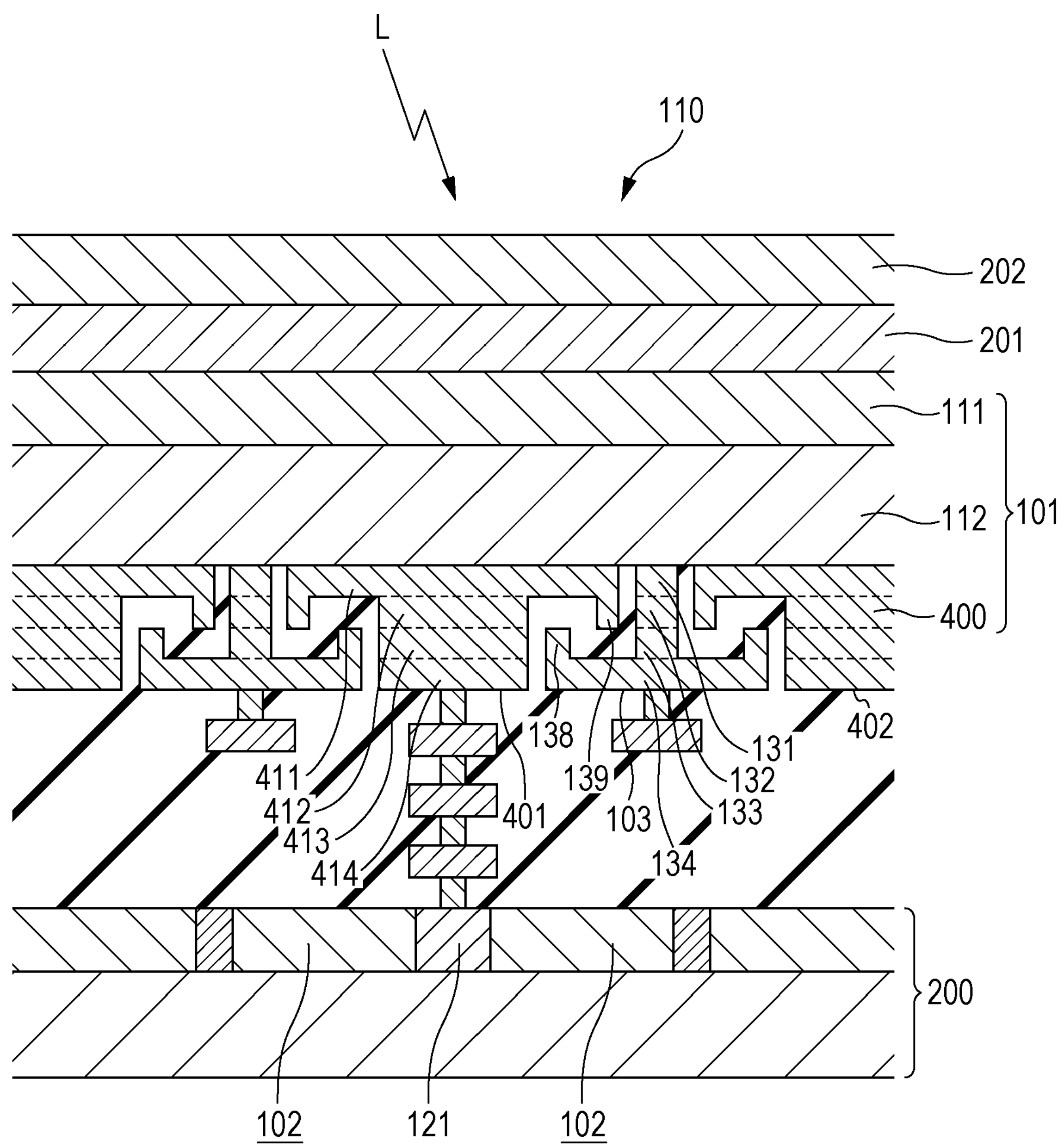
FIG. 14 is a sectional view of another example of variations of the electrode shape.

Also, in a structure depicted in FIG. 14, the first pixel electrode 401 has the tenth layer 414, in addition to the first layer 411 to the third layer 413. Also, each end of the first layer 411 of the first pixel electrode 401 has a first protrusion 139 located in the same layer as the second layer 412. The first electrode 103 has the twelfth layer 134, in addition to the seventh layer 131 to the ninth layer 133. Also, each end of the twelfth layer 134 of the first electrode 103 has a second protrusion 138 located in the same layer as the ninth layer 133.

In this manner, in the first pixel electrode 401 and the first electrode 103 adjacent to each other, the first layer 411 and the twelfth layer 134 located in different layers may alternately protrude to have the edges overlap each other. Furthermore, the first protrusion 139 or the second protrusion 138 which protrudes from one of the overlapping layers to the other may be provided.

This structure can effectively prevent the light L entering from a gap between the first pixel electrodes from undergoing irregular reflection to reach the first charge accumulation region 121. This can effectively inhibit parasitic sensitivity to light of the imaging device.

Figure 15:
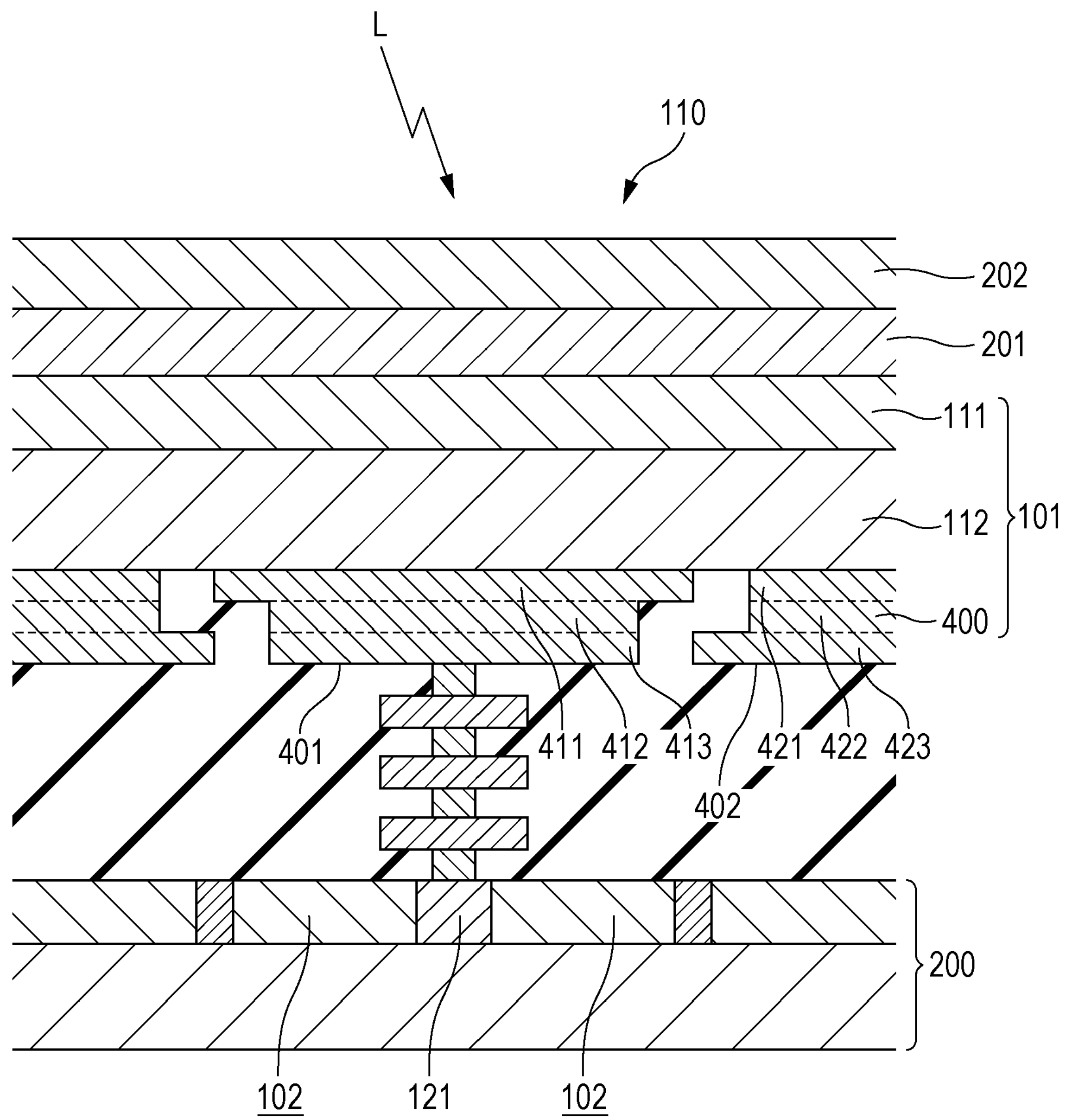
FIG. 15 is a sectional view of still another example of variations of the electrode shape.
Figure 16:
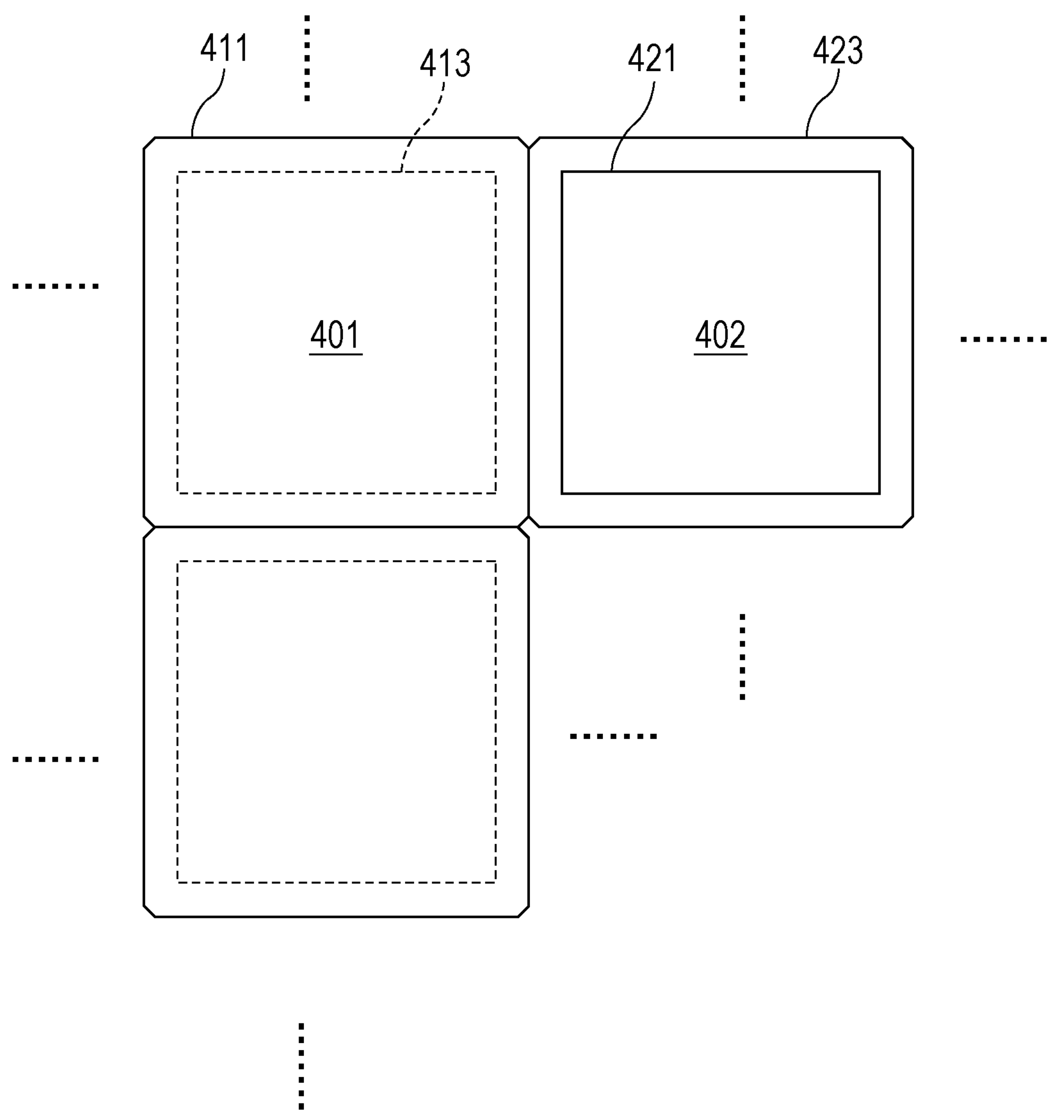
FIG. 16 is a diagram of a planar structure of pixel electrodes corresponding to FIG. 15.

Also, as depicted in FIG. 15 and FIG. 16, in the first pixel electrode 401 and the second pixel electrode 402 adjacent to each other, edges of the first layer 411 and the sixth layer 423 located in different layers may be in contact with each other in a plan view. Also in this structure, the light L entering between the first pixel electrode 401 and the second pixel electrode 402 can be shielded. This can reduce parasitic light sensitivity. Also in this structure, compared with the case in which the first layer 411 and the sixth layer 423 overlap each other in a plan view, the first pixel electrode 401 and the second pixel electrode 402 can be separated. This can more inhibit the parasitic capacitance between the pixel electrodes. Therefore, a decrease in conversion gain of the imaging device can be inhibited.

Figure 17:
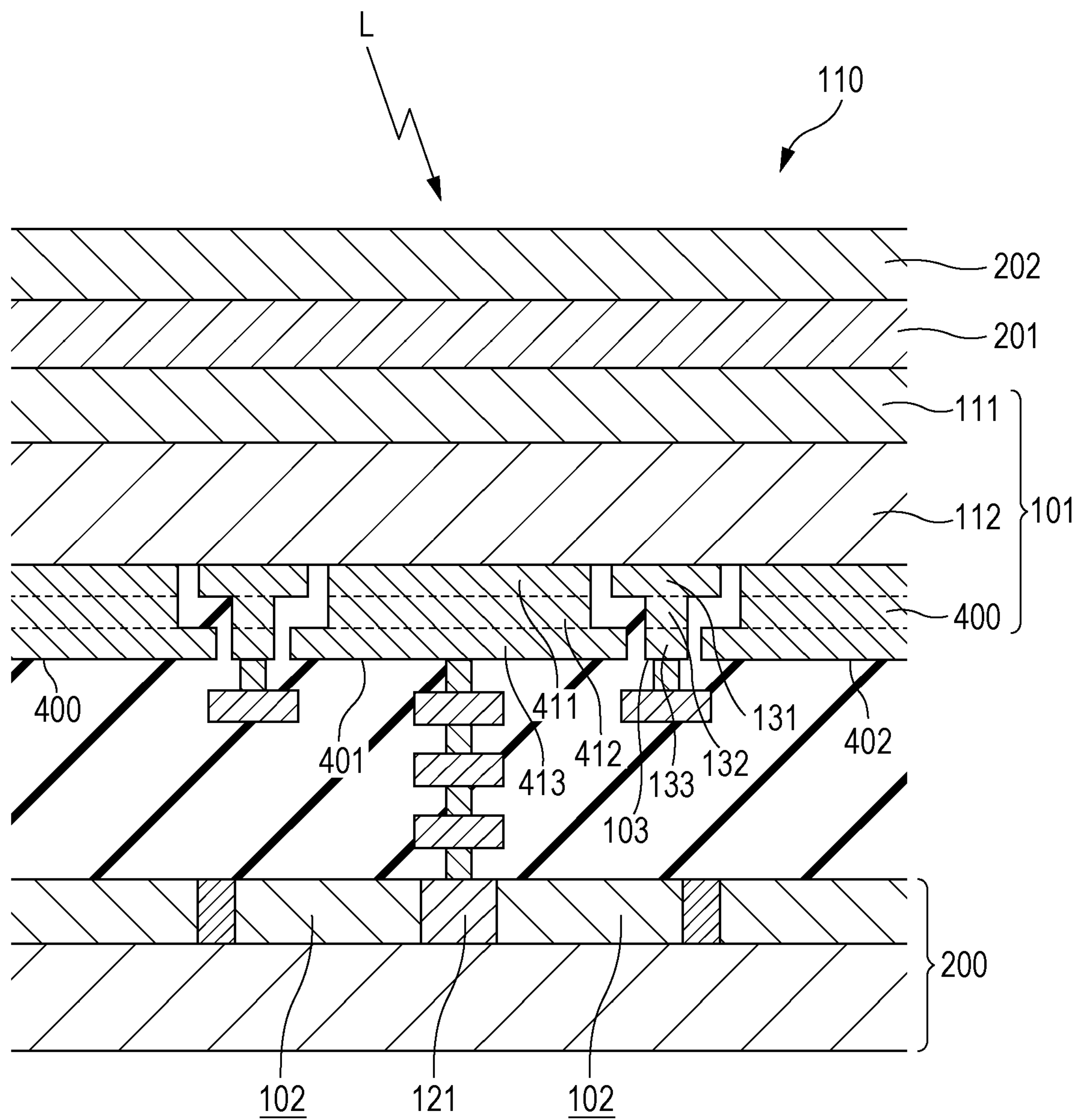
FIG. 17 is a sectional view of yet another example of variations of the electrode shape.

Furthermore, as depicted in FIG. 17, the area of the seventh layer 131 of the first electrode 103 as a layer in contact with the photoelectric conversion layer 112 may be larger than the area of at least one of the eighth layer 132 and the ninth layer 133 located on the semiconductor substrate 200 side of the seventh layer 131.

Figure 18:
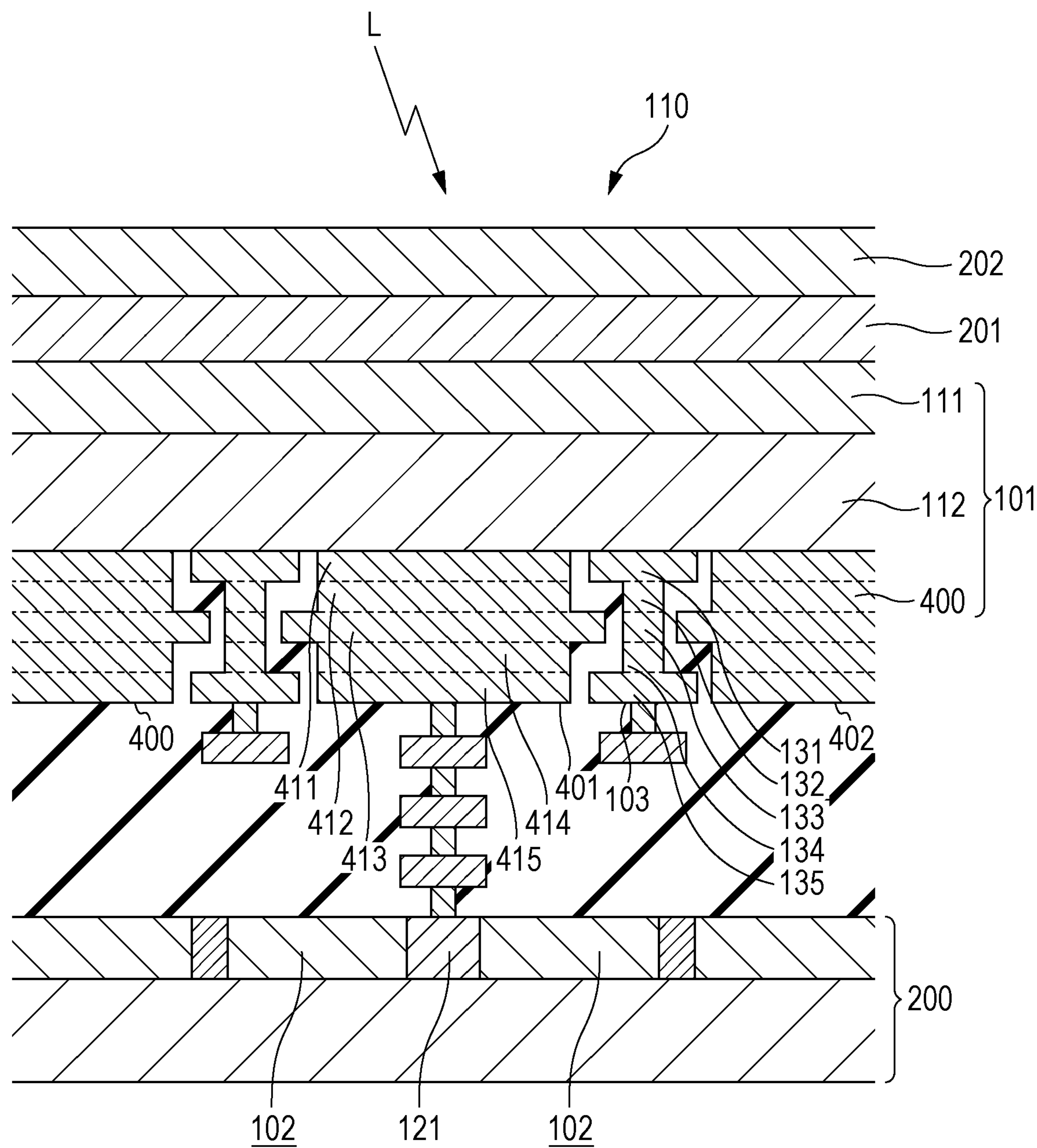
FIG. 18 is a sectional view of yet another example of variations of the electrode shape.

Also, as depicted in FIG. 18, the first pixel electrode 401 and the first electrode 103 located in the same layer and adjacent to each other may have edges overlap a plurality of times in a plan view.

In the structure depicted in FIG. 18, the first pixel electrode 401 has the tenth layer 414 and the eleventh layer 415, in addition to the first layer 411 to the third layer 413. The first electrode 103 has the twelfth layer 134 and the thirteenth layer 135, in addition to the seventh layer 131 to the ninth layer 133. In a plan view, the third layer 413 of the first pixel electrode 401 and the seventh layer 131 and the thirteenth layer 135 of the first electrode 103 overlap one another.

This structure can improve light blocking capability with respect to the light L diagonally entering between the first pixel electrode 401 and the first electrode 103 adjacent to each other. This can more reduce parasitic light sensitivity of the imaging device.

Figure 19:
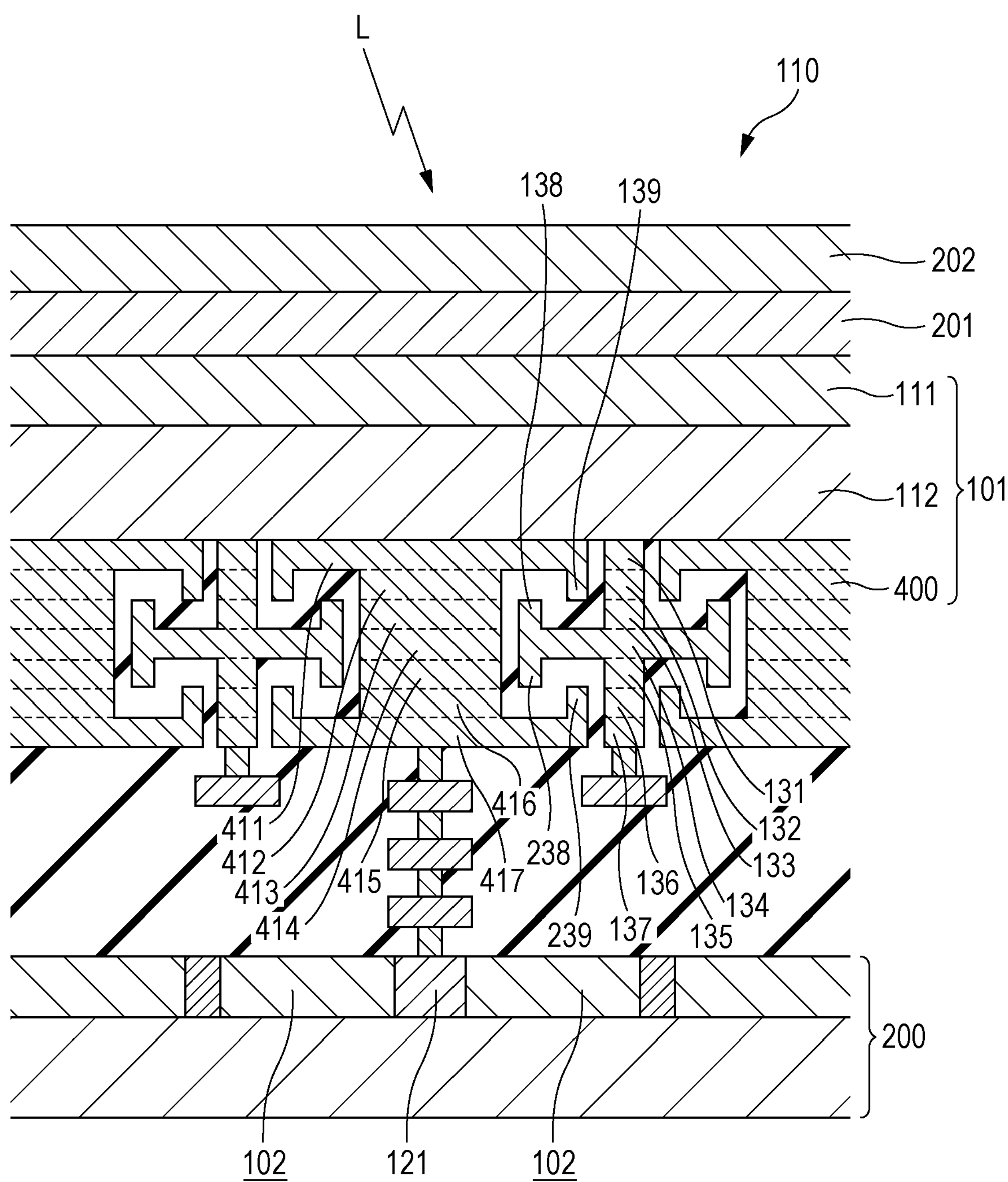
FIG. 19 is a sectional view of yet another example of variations of the electrode shape.

Also, as depicted in FIG. 19, any of the plurality of layers configuring the first pixel electrode 401 and the first electrode 103 may include a protrusion. In the structure depicted in FIG. 19, the first pixel electrode 401 further has a fourteenth layer 416 and a fifteenth layer 417. Each end of the first layer 411 of the first pixel electrode 401 has the first protrusion 139 located in the same layer as the second layer 412. Each end of the fifteenth layer 417 of the first pixel electrode 401 has a third protrusion 239 located in the same layer as the fourteenth layer 416. Also, the first electrode 103 further has a sixteenth layer 136 and a seventeenth layer 137. Each end of the twelfth layer 134 of the first electrode 103 has the second protrusion 138 located in the same layer as the ninth layer 133. Each end of the twelfth layer 134 of the first electrode 103 has a fourth protrusion 238 located in the same layer as the thirteenth layer 135.

This structure can effectively prevent the light L entering from a gap between the first pixel electrodes and the first electrode 103 from undergoing irregular reflection to reach the first charge accumulation region 121 and a charge accumulation region of another pixel. This can effectively inhibit the parasitic sensitivity to light of the imaging device.

Fourth Embodiment

In the first and second embodiments, description is made to the case in which two electrodes adjacent to each other overlap or are in contact with each other in a plan view and are separated in a sectional view. However, two electrodes adjacent to each other may be separated in a plan view.

Figure 20:
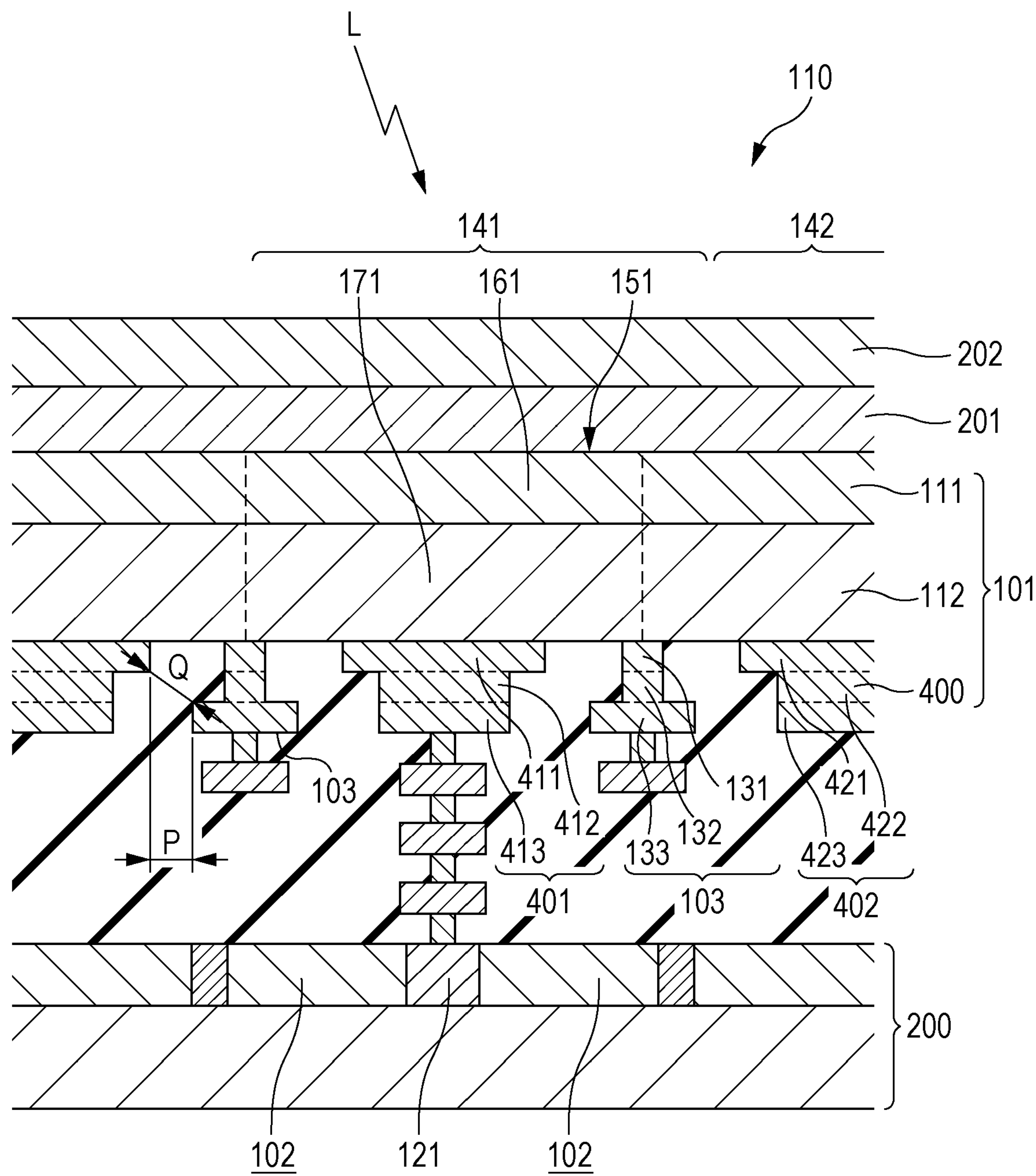
FIG. 20 is a diagram of a sectional structure of an imaging device according to a fourth embodiment.
Figure 21:
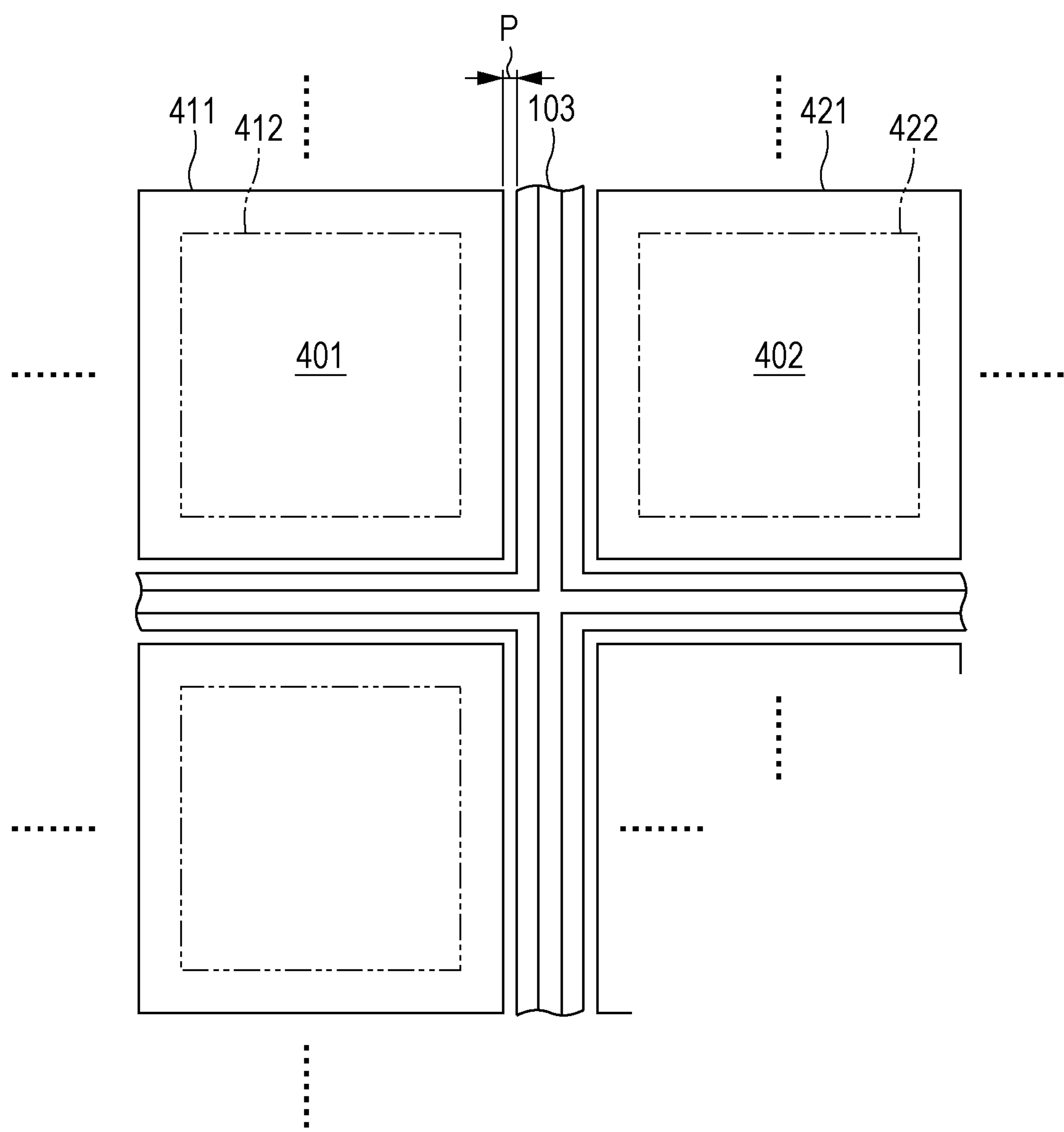
FIG. 21 is a diagram of a planar structure of pixel electrodes of the imaging device according to the fourth embodiment.

FIG. 20 is a diagram of a sectional structure of an imaging device according to a fourth embodiment. FIG. 21 is a diagram of the first pixel electrode and the second pixel electrode adjacent to each other and the first electrode therebetween in a plan view from a photoelectric conversion layer side. As depicted in FIG. 21, the first pixel electrode 401 and the first electrode 103 are separated in a plan view. In this point, FIG. 21 is different from FIG. 11 of the second embodiment. Also in the sectional view depicted in FIG. 20, a shortest distance P between the first pixel electrode 401 and the first electrode 103 in the plan view is smaller than a shortest distance Q between the first pixel electrode 401 and the first electrode 103. Here, the shortest distance P is, for example, a distance between the first layer 411 of the first pixel electrode 401 and the ninth layer 133 of the first electrode 103 in a horizontal direction in FIG. 20. Also, the shortest distance P is, for example, a distance between the first pixel electrode 401 and the first electrode 103 in FIG. 21. On the other hand, the shortest distance Q is, for example, an actual shortest distance between the first layer 411 of the first pixel electrode 401 and the ninth layer 133 of the first electrode 103 in FIG. 20.

According to the present embodiment, part of the light L entering a gap between the first layer 411 of the first pixel electrode 401 and the seventh layer 131 of the first electrode 103 is cut off by the edge of the ninth layer 133 of the first electrode 103. Thus, the light L can be inhibited from reaching the first charge accumulation region 121 or a charge accumulation region of another pixel. This can inhibit the occurrence of a false signal in the first charge accumulation region 121.

While the present embodiment is a modification of the second embodiment, the first embodiment may be modified in a similar manner. Specifically, in FIG. 2 and FIG. 3, the first pixel electrode 401 and the second pixel electrode 402 adjacent to each other may be separated in a plan view. In this case, the shortest distance P between the first pixel electrode 401 and the second pixel electrode 402 in the plan view is smaller than the shortest distance Q between the first pixel electrode 401 and the second pixel electrode 402. Furthermore, the embodiments depicted in FIG. 13 to FIG. 19 may be each modified in a similar manner. These modified embodiments can also inhibit the light L from reaching the charge accumulation region, thereby inhibiting the occurrence of a false signal.

Also, in the specification, when two electrodes adjacent to each other overlap or are in contact with each other in a plan view, the shortest distance P between these two electrodes in the plan view is defined as zero. With this definition, also in each example described in the first and second embodiments, the shortest distance P between two electrodes adjacent to each other in the plan view can be said as being smaller than the shortest distance Q between these electrodes.

The imaging device according to the present disclosure can be used in a camera such as a digital camera and a vehicle-mounted camera.

What is claimed is:

1. An imaging device comprising:

a pixel including a photoelectric converter which converts light into a signal charge, and a charge detection circuit which detects the signal charge, wherein the photoelectric converter includes a photoelectric conversion layer having a first surface and a second surface opposite to the first surface, a pixel electrode on the first surface, a first electrode adjacent to the pixel electrode on the first surface, the first electrode being electrically conductive to the photoelectric conversion layer, and a counter electrode on the second surface, the counter electrode facing the pixel electrode and the first electrode, and the pixel electrode and the first electrode overlap each other in a plan view, wherein the first electrode is electrically insulated from the pixel electrode.

2. The imaging device according to claim 1, wherein the pixel electrode and the first electrode each include a plurality of layers.

3. The imaging device according to claim 2, wherein the pixel electrode includes a first layer, a second layer, and a third layer laminated in that order in a direction away from the photoelectric conversion layer, the first electrode includes a fourth layer, a fifth layer, and a sixth layer laminated in that order in the direction away from the photoelectric conversion layer, and the first layer and the sixth layer overlap each other in the plan view.

4. The imaging device according to claim 2, wherein the pixel electrode includes a first layer, a second layer, and a third layer laminated in that order in a direction away from the photoelectric conversion layer, the first electrode includes a fourth layer, a fifth layer, and a sixth layer laminated in that order in the direction away from the photoelectric conversion layer, and the third layer and the fourth layer overlap each other in the plan view.

5. The imaging device according to claim 1, wherein the first electrode is in contact with the photoelectric conversion layer.

6. The imaging device according to claim 1, further comprising:

a semiconductor substrate having a third surface, wherein the photoelectric converter is located above the third surface, and an uppermost surface of the pixel electrode is equal in height to an uppermost surface of the first electrode, with reference to the third surface.

7. The imaging device according to claim 6, wherein a lowermost surface of the pixel electrode is equal in height to a lowermost surface of the first electrode, with reference to the third surface.

8. A camera system comprising:

the imaging device according to claim 1;

a lens optical system that forms an image at the imaging device; and a camera signal processor that processes a signal outputted from the imaging device.

9. An imaging device comprising:

a pixel including a photoelectric converter which converts light into a signal charge, and a charge detection circuit which detects the signal charge, wherein the photoelectric converter includes a photoelectric conversion layer having a first surface and a second surface opposite to the first surface, a pixel electrode on the first surface, a first electrode adjacent to the pixel electrode on the first surface, the first electrode being electrically conductive to the photoelectric conversion layer, and a counter electrode on the second surface, the counter electrode facing the pixel electrode and the first electrode, and the imaging device in a plan view has no gap between the pixel electrode and the first electrode, wherein the first electrode is electrically insulated from the pixel electrode.

10. The imaging device according to claim 9, wherein the pixel electrode and the first electrode each include a plurality of layers.

11. The imaging device according to claim 10, wherein the pixel electrode includes a first layer, a second layer, and a third layer laminated in that order in a direction away from the photoelectric conversion layer, the first electrode includes a fourth layer, a fifth layer, and a sixth layer laminated in that order in the direction away from the photoelectric conversion layer, and the first layer and the sixth layer overlap each other in the plan view.

12. The imaging device according to claim 10, wherein the pixel electrode includes a first layer, a second layer, and a third layer laminated in that order in a direction away from the photoelectric conversion layer, the first electrode includes a fourth layer, a fifth layer, and a sixth layer laminated in that order in the direction away from the photoelectric conversion layer, and the third layer and the fourth layer overlap each other in the plan view.

13. The imaging device according to claim 9, wherein the first electrode is in contact with the photoelectric conversion layer.

14. The imaging device according to claim 9, further comprising:

a semiconductor substrate having a third surface, wherein the photoelectric converter is located above the third surface, and an uppermost surface of the pixel electrode is equal in height to an uppermost surface of the first electrode, with reference to the third surface.

15. The imaging device according to claim 14, wherein a lowermost surface of the pixel electrode is equal in height to a lowermost surface of the first electrode, with reference to the third surface.

16. A camera system comprising:

the imaging device according to claim 9;

a lens optical system that forms an image at the imaging device; and a camera signal processor that processes a signal outputted from the imaging device.

* * * * *